(12) United States Patent
Li

(10) Patent No.: US 12,588,183 B2
(45) Date of Patent: Mar. 24, 2026

(54) SEMICONDUCTOR MEMORY STRUCTURE WITH BUTTED CONTACT AND METHOD FOR MANUFACTURING SAME

(71) Applicant: CHANGXIN MEMORY TECHNOLOGIES, INC., Hefei City (CN)

(72) Inventor: Min Li, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 412 days.

(21) Appl. No.: 18/182,456

(22) Filed: Mar. 13, 2023

(65) Prior Publication Data

US 2023/0380134 A1     Nov. 23, 2023

(30) Foreign Application Priority Data

May 18, 2022   (CN) .......................... 202210542749.3

(51) Int. Cl.
*H10B 12/00*          (2023.01)
(52) U.S. Cl.
CPC ......... *H10B 12/0335* (2023.02); *H10B 12/05* (2023.02); *H10B 12/50* (2023.02)

(58) Field of Classification Search
CPC .... H10B 12/0335; H10B 12/05; H10B 12/50; H01L 23/5283; H01L 21/76895; H01L 23/481; H10D 84/0149; H10D 84/038; H10D 84/83
See application file for complete search history.

(56) References Cited

U.S. PATENT DOCUMENTS

| | | | |
|---|---|---|---|
| 2020/0111798 A1* | 4/2020 | Paul ................... | H10D 30/6757 |
| 2022/0051936 A1 | 2/2022 | Chuang | |
| 2023/0091786 A1* | 3/2023 | Liu .................... | H10B 12/0335 |
| | | | 257/213 |

FOREIGN PATENT DOCUMENTS

CN          104658966 A      5/2015

* cited by examiner

*Primary Examiner* — John P. Dulka
(74) *Attorney, Agent, or Firm* — Syncoda LLC; Feng Ma

(57)          ABSTRACT

Provided is a semiconductor structure and a method for manufacturing the same. The semiconductor structure includes a substrate, and a first gate structure and a first contact structure on the substrate, the first contact structure includes a first contact part and a second contact part, the first contact part is connected to the second contact part, the first contact part is located between the second contact part and the substrate, the first contact structure is electrically connected to the first gate structure and the substrate, and sectional area of the first contact part is greater than sectional area of the second contact part.

20 Claims, 14 Drawing Sheets

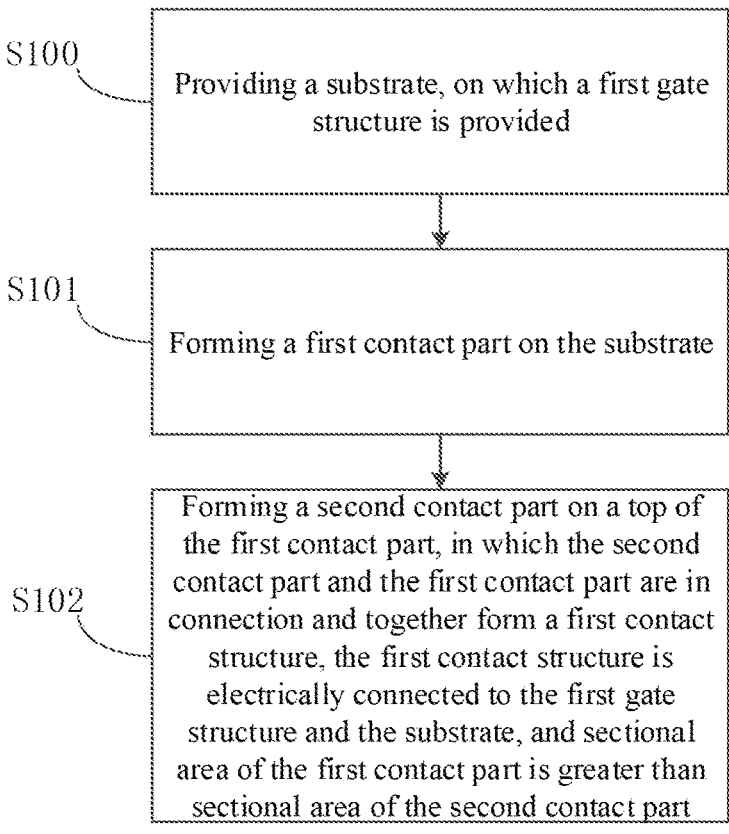

S100 — Providing a substrate, on which a first gate structure is provided

S101 — Forming a first contact part on the substrate

S102 — Forming a second contact part on a top of the first contact part, in which the second contact part and the first contact part are in connection and together form a first contact structure, the first contact structure is electrically connected to the first gate structure and the substrate, and sectional area of the first contact part is greater than sectional area of the second contact part

FIG. 3

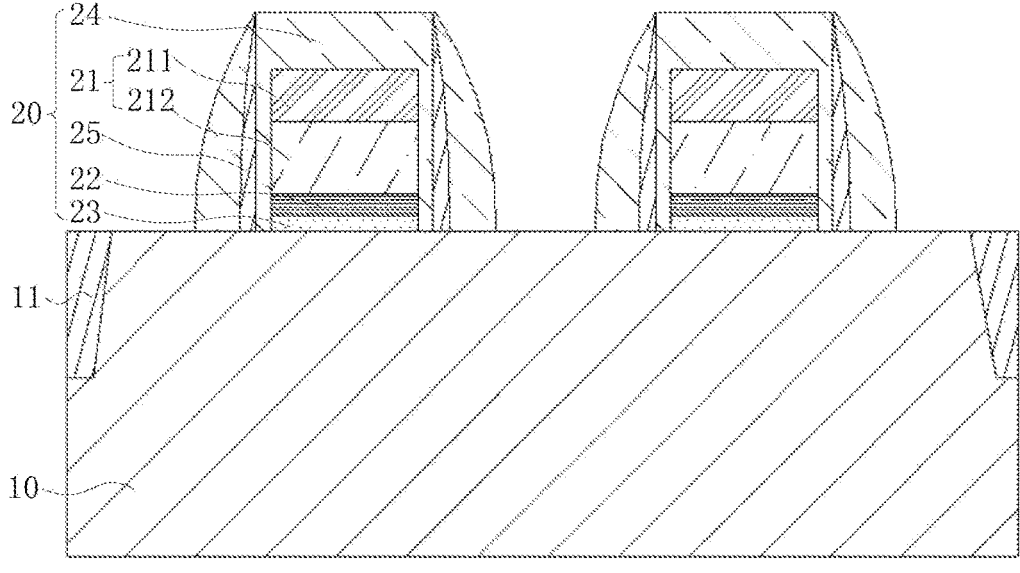

FIG. 4

SEMICONDUCTOR MEMORY STRUCTURE WITH BUTTED CONTACT AND METHOD FOR MANUFACTURING SAME

CROSS-REFERENCE TO RELATED APPLICATION

This application claims priority to Chinese Patent Application No. 202210542749.3, filed on May 18, 2022, the disclosure of which is hereby incorporated by reference in its entirety.

BACKGROUND

Memories, controllers or other electronic devices are usually provided with semiconductor structures. The semiconductor structures include metal oxide semiconductor field effect transistors (MOS transistors), which is used to realize switching, amplifying or other functions. The MOS transistor includes a substrate and a gate formed on the substrate. The substrate is provided with a source region and a drain region which are arranged at intervals. A gate is located between the source region and the drain region.

In the related art, a gate, a source/drain region and a conductive plug are in electrical connection to realize a single conductive function. However, there is a great contact resistance between the conductive plug and the source/drain region, which affects the performance of the semiconductor structure.

SUMMARY

The application relates to the technical field of semiconductors, in particular to a semiconductor structure and a method for manufacturing the same.

In the first aspect, embodiments of the disclosure provide a semiconductor structure. The semiconductor structure includes a substrate, and a first gate structure and a first contact structure on the substrate, the first contact structure includes a first contact part and a second contact part, the first contact part is connected to the second contact part, and the first contact part is located between the second contact part and the substrate.

The first contact structure is electrically connected to the first gate structure and the substrate, and sectional area of the first contact part is greater than sectional area of the second contact part.

In the second aspect, embodiments of the disclosure provide a method for manufacturing a semiconductor structure, which includes the following operations.

A substrate provided, on which a first gate structure is provided.

A first contact part is formed on the substrate.

A second contact part is formed on a top of the first contact part, in which the second contact part and the first contact part are connected and together form a first contact structure, the first contact structure is electrically connected to the first gate structure and the substrate, and sectional area of the first contact part is greater than sectional area of the second contact part.

BRIEF DESCRIPTION OF THE DRAWINGS

In order to more clearly illustrate the technical solution of embodiments of the disclosure or the technical solution in the related art, the drawings for the description of the embodiments or the related art will be briefly introduced herein below. Apparently, the drawings in the following description are some embodiments of this disclosure, and for an ordinary person skilled in the art, other drawings can be obtained according to these drawings without creative efforts.

FIG. 3 is a schematic flowchart of a method for manufacturing a semiconductor structure provided by an embodiment of the disclosure;

FIG. 4 is a schematic structural diagram 1 corresponding to providing a substrate in a method for manufacturing a semiconductor structure provided by an embodiment of the disclosure;

DETAILED DESCRIPTION

Figure 1:
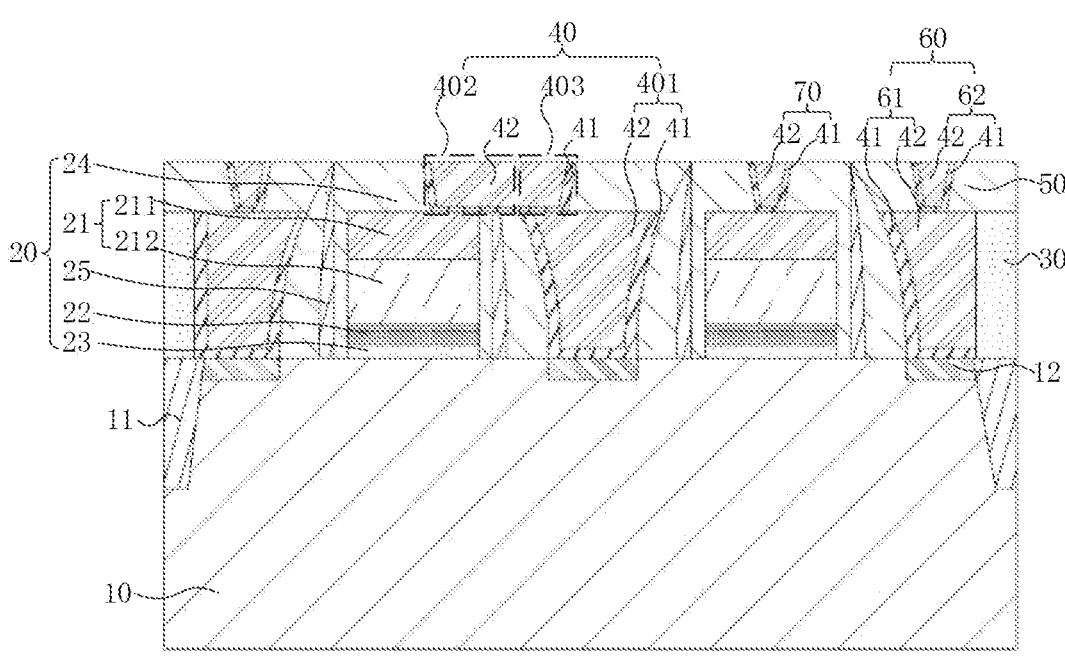
FIG. 1 is a schematic structural diagram 1 of a semiconductor structure provided by an embodiment of the disclosure.

In the actual research process, the inventor of the disclosure find that in a DRAM of the related art, a signal transmission is completed by c a contact plug connected with part of a substrate. For example, in a transistor structure of the DRAM, an active area is formed by doping the substrate, thereby forming a source region and a drain region, respectively, and a channel is located between the source region and the drain region. In order to realize a single conductive function, the contact plug is in contact with and electrically connected to the substrate of the source region or the drain region, and is also electrically connected to a gate structure, thus a conductive plug with an interconnection function is provided. Herein, the cross-sectional area of the contact plug is substantially constant in the extending direction thereof. However, with the continuous improvement of the integration degree of the DRAM, in the above DRAM, the area of the contact portion between the contact plug and the substrate may decrease correspondingly, which leads to the increase of the contact resistance between the contact plug and the substrate, and thus the signal transmission of the contact plug in the substrate is affected, thereby affecting the storage performance of a semiconductor memory.

In view of this, embodiments of the disclosure provide a semiconductor structure and a method for manufacturing the same. The semiconductor structure includes a substrate, and a first gate structure and a first contact structure are provided on the substrate, in which the first contact structure includes a first contact part and a second contact part, the first contact part is connected to the second contact part, the first contact part is located between the second contact part and the substrate, the first contact structure is electrically connected to the first gate structure and to the substrate, and sectional area of the first contact part is greater than sectional area of the second contact part. Compared with the related art, according to the disclosure, as the integration degree of the semiconductor structure is increasing, the contact area between the first contact structure and the substrate can be ensured, and the contact resistance of silicon surface is reduced. As a result, the signal transmission efficiency and stability are improved, thereby improving the performance of the semiconductor structure.

In order to make the objectives, technical solution and advantages of the disclosure clearer, the technical solution in the embodiments of this disclosure will be described in more detail below with reference to the drawings in the preferred embodiments of this disclosure. In the drawings, the same or similar reference numeral indicates the same or similar element throughout the text. The described embodiments are part of embodiments of this disclosure, not all of them. The embodiments described below with reference to the accompanying drawings are exemplary and are intended to illustrate the disclosure, and cannot be understood as limitations to the disclosure. Based on the embodiments of the disclosure, any other embodiments obtained by an ordinary person skilled in the art without creative efforts are within the protection scope of the disclosure. The embodiments of the disclosure are described in detail below with reference to the accompanying drawings.

Figure 2:
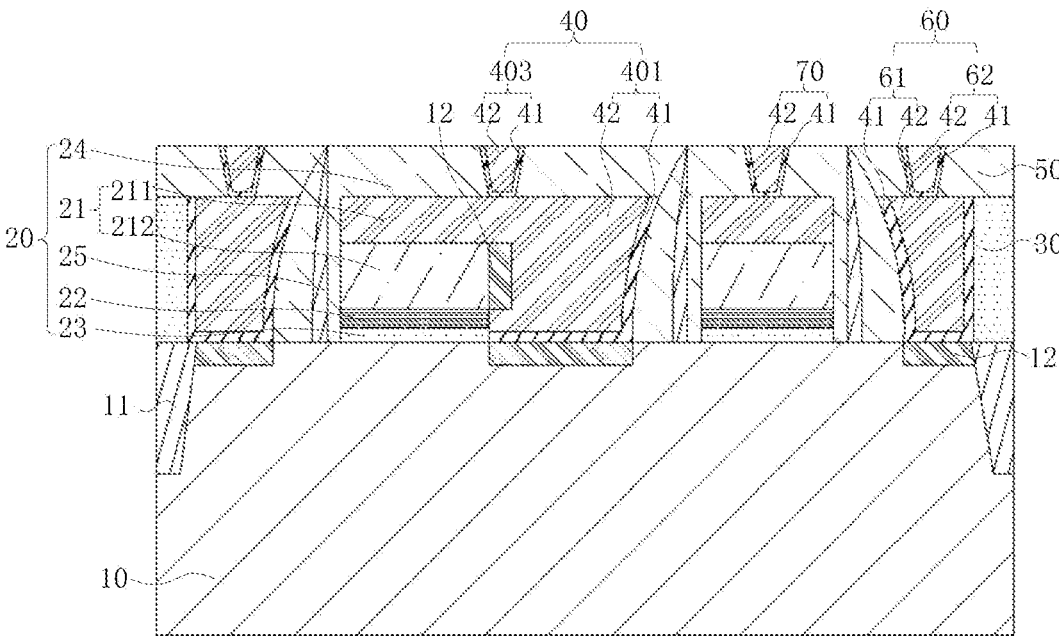
FIG. 2 is a schematic diagram 2 of a semiconductor structure provided by an embodiment of the disclosure.
Figure 5:
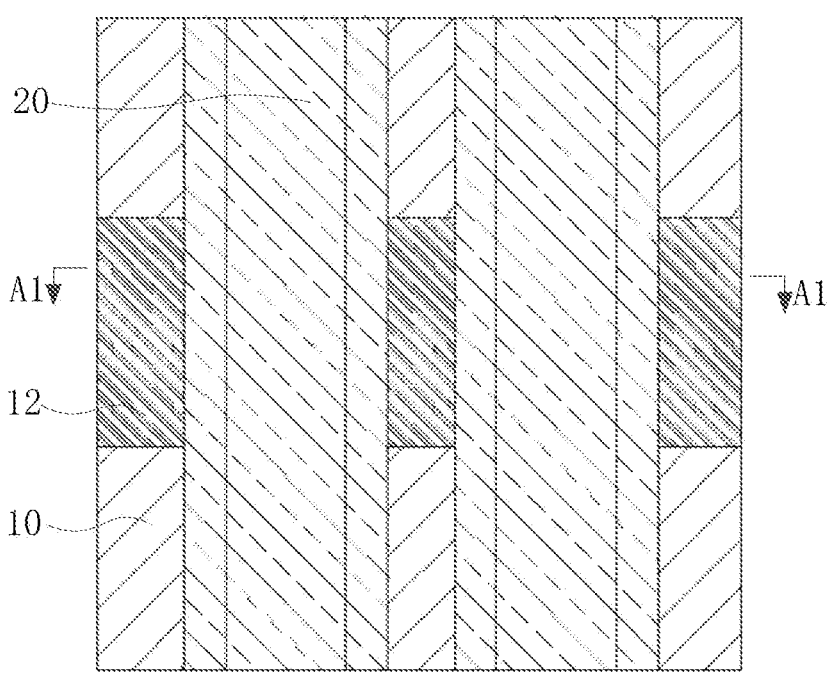
FIG. 5 is a schematic structural diagram 1 corresponding to forming conductive contact pads in a method for manufacturing a semiconductor structure provided by an embodiment of the disclosure.
Figure 6:
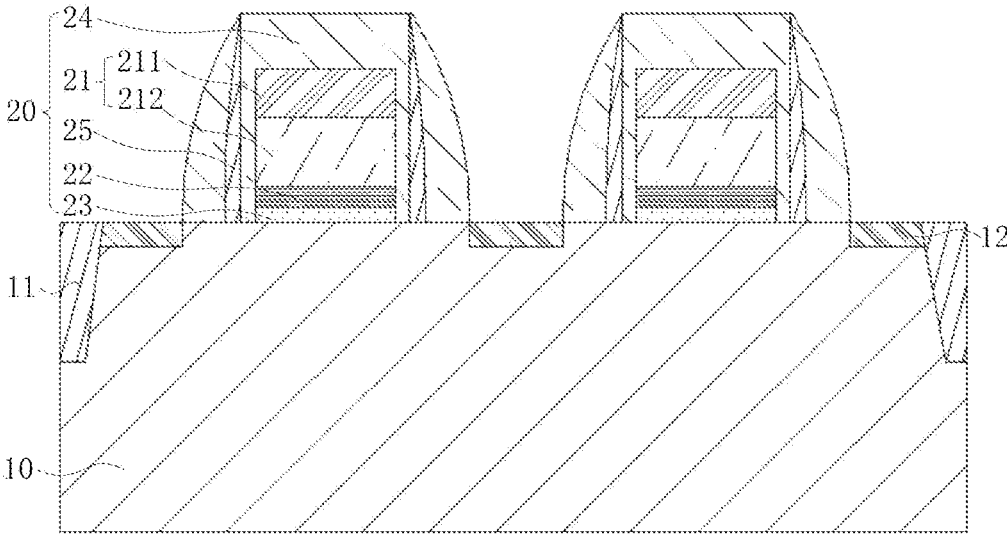
FIG. 6 is a cross-sectional view of a section at A1-A1 in FIG. 5.

As shown in FIG. 1 and FIG. 2, a semiconductor structure includes a substrate 10, and a first gate structure 20 and a first contact structure 40 are provided on the substrate 10. The first contact structure 40 includes a first contact part 401 and a second contact part 403, the first contact part 401 is connected to the second contact part 403, and the first contact part 401 is located between the second contact part 403 and the substrate 10. The first contact structure 40 is electrically connected to the first gate structure 20 and the substrate 10. A sectional area of the first contact part 401 is greater than a sectional area of the second contact part 403.

Herein, the semiconductor structure provided by the embodiments of the disclosure may be a memory device or a non-memory device. The memory device may include, for example, a dynamic random access memory (DRAM), a static random access memory (SRAM), a flash memory, an electrically erasable programmable read-only memory (EE-PROM), a phase change random access memory (PRAM) or a magnetoresistive random access memory (MRAM). The non-memory device may be a logic device (e.g. a microprocessor, a digital signal processor, or a microcontroller) or a similar device. The embodiments of the disclosure are described by taking the DRAM as an example.

Herein, the substrate 10 can provide a structural foundation for subsequent structures and processes. The material of the substrate 10 may include one or more of silicon, germanium, silicon germanium, silicon carbide, silicon-on-insulator or a germanium-on-insulator. In the embodiments, the substrate 10 is a silicon substrate 10. A conductive contact region (not shown in the figures) can be formed in the silicon substrate 10 by doping. For example, phosphorus may be doped in the silicon substrate 10. With the conductive contact region, the substrate 10 can contact with and be electrically conducted to the first contact structure 40.

In the embodiments, the conductive contact region is also covered with conductive contact pads 12. The material of the conductive contact pads 12 may be a metal silicide, thereby improving the conductivity between the first contact structure 40 and the substrate 10. The material of the conductive contact pads 12 may include, for example, a copper silicide, a cobalt silicide or a tungsten silicide.

The substrate 10 may also be provided with a core region and a peripheral region. The peripheral region surrounds the periphery of the core region. A memory element is provided on the substrate 10 of the core region, and various electronic elements including a control element may be provided on the substrate 10 of the peripheral region. The embodiment is not limited thereto. The memory element located in the core region may include a capacitor and a transistor. The gate of the transistor is connected to a word line (WL), the drain is connected to a bit line, and the source is connected to the capacitor. A voltage signal of the word line can control the transistor to turn on or off, and then data information stored in the capacitor is read through the bit line, or data information is written into the capacitor for storage through the bit line. The word line is connected to a word line driver via a contact (also known as a local interconnect contact or LICON) located in the peripheral region of the memory element, thus facilitating the word line driver to input a voltage signal to the word line. The conductive contact region of the embodiments can be formed in the core region or in the peripheral region.

The first gate structure 20 provided on the substrate 10 may form the gate of the memory element of the core region, and may be in the peripheral region. The first gate structure 20 may include a gate conductive layer 21, a gate isolation layer 24 and an insulation sidewall 25. The gate conductive layer 21 is provided on the substrate 10. In the embodiments, a gate oxide layer 22 and a titanium nitride layer 23 may be provided between the gate conductive layer 21 and the substrate 10. Herein, the titanium nitride layer 23 covers the substrate 10, and the gate oxide layer 22 covers the side of the titanium nitride layer 23 away from the substrate 10. The gate isolation layer 24 is located on the side of the gate conductive layer 21 away from the substrate 10, and the insulation sidewall 25 covers the sidewalls of the gate conductive layer 21 and the gate isolation layer 24. The gate conductive layer 21 may be made of a metal, for example, tungsten. The material of the gate isolation layer 24, for example, may be chosen as silicon nitride. The insulation sidewall 25 may be a composite layer of silicon nitride-silicon oxide-silicon nitride, or a composite layer of silicon oxide-silicon nitride-silicon oxide.

The first contact structure 40 includes a first contact part 401 and a second contact part 403. The first contact part 401 is in contact with and electrically conducted to the conductive contact region of the substrate 10 to realize a signal transmission between the first contact structure 40 and the substrate 10. In addition, the first contact structure 40 is also in contact with and electrically conducted to the gate conductive layer 21 of the first gate structure 20, so that the first contact structure 40 is formed as an interconnecting contact part between the first gate structure 20 and the substrate 10 to realize a single conductive function.

In the embodiments, the sectional area of the first contact part 401 is greater than the sectional area of the second contact part 403, which can effectively increase the contact area between the first contact part 401 and the substrate 10. Compared with the related art, according to the disclosure, as the integration degree of the semiconductor structure is increasing, the contact area between the first contact structure 40 and the substrate 10 can be ensured, and the contact resistance of silicon surface is reduced, and thus the signal transmission efficiency and stability are improved, thereby improving the performance of the semiconductor structure.

Referring to FIG. 1, in a possible embodiment, a conductive structure 402 is provided at the end of the first gate structure 20 away from the substrate 10. The conductive structure 402 is in contact with the gate conductive layer 21 and electrically connected to the second contact part 403, and the conductive structure 402 and the second contact part 403 are located in the same plane. The first contact part 401 is electrically conductive to the gate conductive layer 21 via the second contact part 403 and the conductive structure 402 by providing the conductive structure 402. The conductive structure 402 and the second contact part 403 in the same plane is beneficial to form the conductive structure 402 and the second contact part 403 in the same layer during manufacture, thereby improving the manufacturing efficiency of the semiconductor structure.

Still referring to FIG. 1, the conductive structure 402 is in contact with the second contact part 403, and the conductive structure 402 and the second contact part 403 can be integrally formed, which is beneficial to reduce the manufacturing difficulty of the conductive structure 402 and the second contact part 403, thereby improving the manufacturing efficiency of the semiconductor structure. Furthermore, the materials of the conductive structure 402 and the second contact part 403 are same, so as to avoid affecting the conductivity of the whole structure due to different materials. In addition, it is also beneficial to adjust the sectional area of the integrated structure formed by the conductive structure 402 and the second contact part 403, to realize the adjustment of the contact area between the first contact part 401 and the integrated structure formed by the conductive structure 402 and the second contact part 403, thereby improving the conductivity of the first contact structure 40.

Of course, in some other embodiments, the conductive structure 402 and the second contact part 403 may also be provided with other conductive component(s), so that the conductive structure 402 and the second contact part 403 are electrically conducted via other conductive component(s).

An isolation layer 41 is provided in the bottoms and sidewalls of the conductive structure 402 and the second contact part 403. A conductive material 42 is covered on the isolation layer 41, and the conductive material 42 and the isolation layer 41 together form an integrated structure. Herein, the material of the isolation layer 41 may be titanium nitride with good corrosion resistance, good conductivity and good intermetallic adhesion, so that the integrated structure formed by the conductive structure 402 and the second contact part 403 has a good electrical connection performance with the gate conductive layer 21 and the first contact part 401, respectively. Further, the conductive material 42 may include a conductive metal, for example, titanium, tungsten or the like.

Referring to FIG. 2, in another possible embodiment, in the first gate structure 20, an insulation sidewall 25 is covered on one side of the gate conductive layer 21 and the gate isolation layer 24, and the other side of the gate conductive layer 21 and the gate isolation layer 24 is exposed. Here, "exposed" means that the other side of the gate conductive layer 21 and the gate isolation layer 24 is not covered by an insulation sidewall 25. The first contact part 401 covers the side of the gate conductive layer 21 away from the insulation sidewall 25, and the first contact part 401 is in contact with the sidewall of the gate conductive layer 21, so that the first contact part 401 is electrically conductive to the gate conductive layer 21. Moreover, the top surface of the first contact part 401 is flush with the top surface of the gate conductive layer 21, which is beneficial to form the second contact part 403 on the top surface of the first contact part 401 and the top surface of the gate conductive layer 21, to adjust the contact area between the second contact part 403 and the top surfaces of the first contact part 401 and the gate conductive layer 21, thereby improving the conductivity of the first contact structure 40.

Still referring to FIG. 2, part of the sidewall of the gate conductive layer 21 is covered with a conductive contact pad 12, and the first contact part 401 is in contact with the top surface of the conductive contact pad 12. Similarly, by providing the conductive contact pad 12 on the gate conductive layer 21, it is beneficial to further improve the conductivity between the first contact structure 40 and the gate conductive layer 21. Herein, the gate conductive layer 21 includes a first conductive layer 212 and a second conductive layer 211. The first conductive layer 212 covers the side of the gate oxide layer 22 away from the substrate 10, and the second conductive layer 211 covers the first conductive layer 212. The material of the second conductive layer 211 may include a conductive metal, such as, titanium, tungsten or the like. The material of the first conductive layer 212 may include, for example, polysilicon. The conductive contact pad 12 may cover the sidewall of the first conductive layer 212.

In the embodiment that the first contact part 401 is in contact with the sidewall of the gate conductive layer 21, an isolation layer 41 is provided at the bottom and on sidewalls of the second contact part 403. A conductive material 42 is covered on the isolation layer 41, and the conductive material 42 and the isolation layer 41 together form the second contact part 403. Herein, the material of the isolation layer 41 may be titanium nitride which has a good corrosion resistance, a good conductivity and a good intermetallic adhesion, so that the second contact part 403 has a good electrical connection performance with the gate conductive layer 21 and the first contact part 401, respectively. Further, the material of the conductive material 42 may include a conductive metal, such as, titanium, tungsten or the like.

Other structures in these embodiments are described below with reference to FIG. 1 and FIG. 2.

In the embodiments, an isolation layer 41 is provided at the bottom and on sidewalls of the first contact part 401. A conductive material 42 is covered on the isolation layer 41, and the conductive material 42 and the isolation layer 41 together form the first contact part 401. Herein, the material of the isolation layer 41 may be titanium nitride with good corrosion resistance, good conductivity and good intermetallic adhesion, so that the first contact part 401 has a good electrical connection performance with the substrate 10. Further, the material of the conductive material 42 may include a conductive metal, such as, titanium, tungsten or the like.

In the embodiments, a first dielectric layer 30 and a second dielectric layer 50 are provided on the substrate 10. The first dielectric layer 30 is located between the second dielectric layer 50 and the substrate 10, and the top surface of the first dielectric layer 30 is flush with the top surface of the gate conductive layer 21. The top surface of the second dielectric layer 50 is flush with the top surface of the first gate structure 20. By providing the first dielectric layer 30 and the second dielectric layer 50, the structural regularity of the semiconductor structure can be improved, thereby reducing the manufacturing difficulty. Further, the first contact part 401 can be manufactured in the first dielectric layer 30, and the top surface of the first contact part 401 can be flush with the top surface of the gate conductive layer 21 The second contact part 403 can be manufactured in the second dielectric layer 50, and the top surface of the second contact part 403 can be flush with the top surface of the first gate structure 20 The manufacturing difficulty is reduced, thereby improving the manufacturing efficiency of the semiconductor structure.

In the embodiments, the substrate 10 is also provided with a second gate structure. The second gate structure and first gate structure 20 are spaced apart from each other on the substrate 10. The first gate structure 20 and the second gate structure are located between adjacent shallow trench isolation structures 11. The first contact structure 40 is located between the first gate structure 20 and the second gate structure and is in contact with a sidewall of the first gate structure and the second gate structure, respectively. The first gate structure 20 may include a gate conductive layer 21, a gate isolation layer 24 and an insulation sidewall 25. The gate conductive layer 21 is provided on the substrate 10. A gate oxide layer 22 and a titanium nitride layer 23 may be provided between the gate conductive layer 21 and the substrate 10. Herein, the titanium nitride layer 23 covers the substrate 10, and the gate oxide layer 22 covers the surface of the titanium nitride layer 23 away from the substrate 10. The gate isolation layer 24 is located on the surface of the gate conductive layer 21 away from the substrate 10, and the insulation sidewall 25 covers a sidewall of the gate conductive layer 21 and the gate isolation layer 24. The gate conductive layer 21 may be made of a metal, for example, tungsten. The material of the gate isolation layer 24, for example, may be chosen as silicon nitride. The insulation sidewall 25 may be a composite layer of silicon nitride-silicon oxide-silicon nitride, or a composite layer of silicon oxide-silicon nitride-silicon oxide.

As shown in FIG. 1, in one possible embodiment, one side of the first contact part 401 is in contact with the insulation sidewall 25 of the first gate structure 20, while the other side of the first contact part 401 is in contact with the insulation sidewall 25 of the second gate structure. As shown in FIG. 2, in another possible embodiment, one side of the first contact part 401 is in contact with a sidewall of the gate conductive layer 21 of the first gate structure 20, while the other side of the first contact part 401 is in contact with the insulation sidewall 25 of the second gate structure. With the above arrangements, it is beneficial for the first contact part 401 to make full use of the space between the first gate structure 20 and the second gate structure, which is beneficial to improve the conductivity of the first contact structure 40.

The substrate 10 is also provided with a second contact structure 60. The second contact structure 60 is located at the side of the first gate structure 20 away from the first contact structure 40, and the second contact structure 60 is also located at the side of the second gate structure away from the first contact structure 40. In the same way, the third contact part 61 is in contact with and electrically conductive to the conductive contact region of the substrate 10 to realize a signal transmission between the second contact structure 60 and the substrate 10.

In the embodiment, a second contact structure 60 may include a third contact part 61 and a fourth contact part 62. The third contact part 61 is connected to the fourth contact part 62, and the third contact part 61 is located between the fourth contact part 62 and the substrate 10. The third contact part 61 is in contact with the substrate 10 and is electrically connected to the substrate 10. The sectional area of the third contact part 61 is greater than the sectional area of the fourth contact part 62. Since the sectional area of the third contact part 61 is greater than the sectional area of the fourth contact part 62, the contact area between the third contact part 61 and the substrate 10 can be effectively enlarged. As a result, as the integration degree of the semiconductor structure is increasing, the contact area between the second contact structure 60 and the substrate 10 can be ensured, thereby reducing the contact resistance. As a result, the signal transmission efficiency and stability are improved, thereby improving the performance of the semiconductor structure.

Further, the top surface of the third contact part 61 can be flush with the top surface of the gate conductive layer 21, and the top surface of the fourth contact part 62 can be flush with the top surface of the first gate structure 20. The above arrangement is beneficial to improve the structural regularity of the second contact structure 60 and reduce the manufacturing difficulty of the semiconductor structure.

On the basis of the above embodiment, referring to FIG. 3, the second aspect of the embodiments of the disclosure provides a method for manufacturing a semiconductor structure, which includes the following operations.

At S100, a substrate provided with a first gate structure is provided.

Figure 18:
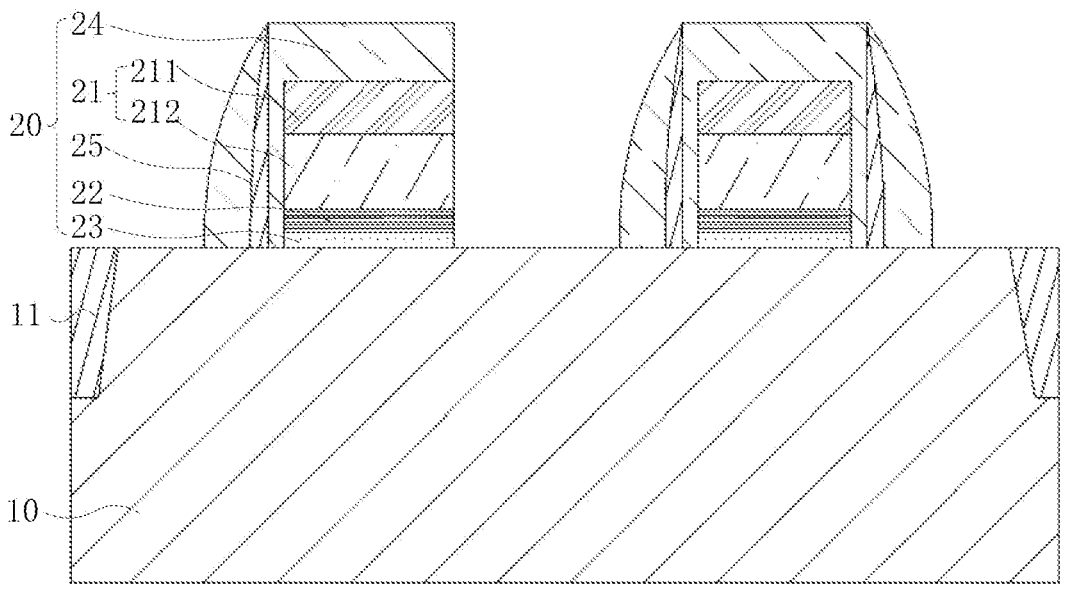
FIG. 18 is a schematic structural diagram 2 corresponding to providing a substrate in a method for manufacturing a semiconductor structure provided by an embodiment of the disclosure.

Referring to FIG. 4 and FIG. 18, a substrate 10 provides a structural foundation for a first gate structure 20. In the embodiment, providing the substrate 10 provided with the first gate structure 20 further includes: the substrate 10 also being provided with a second gate structure, the second gate structure and the first gate structure being arranged spaced apart from each other. Similar to the above embodiment, the substrate 10 is also provided with a plurality of conductive contact regions, and the first gate structure 20 and the second gate structure can locate on the substrate 10 of a core region or on the substrate 10 of a peripheral region.

In the embodiment, referring to FIG. 5, FIG. 6, FIG. 19 and FIG. 20, after providing the substrate 10, the method further includes forming conductive contact pads 12. In a specific implementation model, a metal material layer is formed on a conductive contact region. During the treatment, the metal material layer reacts with elemental silicon of the substrate 10 to form a metal silicide. The metal silicide has conductivity and forms the conductive contact pads 12. Then, the metal material layer not reacted with the substrate 10 is removed. The "treatment" may include, but is not limited to, an annealing process. Here, the material of the metal material layer may include, but is not limited to, copper, cobalt or tungsten. Accordingly, the material of the formed conductive contact pads 12 may include a copper silicide, a cobalt silicide or a tungsten silicide.

At S101, a first contact part is formed on the substrate.

Referring to FIG. 7 to FIG. 12, and FIG. 21 to FIG. 24, in the embodiment, a first contact part 401 is formed between the first gate structure 20 and the second gate structure and is in contact with a sidewall of the first gate structure 20 and a sidewall of the second gate structure, respectively, which is beneficial for the first contact part 401 to make full use of the space between the first gate structure 20 and the second gate structure, and is beneficial to improve the conductivity of the first contact structure 40.

Forming the first contact part 401 on the substrate 10 further includes forming a third contact part 61 on the substrate 10, in which the third contact part 61 is in contact with and is electrically connected to the substrate 10.

In the embodiment, one part of the third contact part 61 is located at the side of the first gate structure 20 away from the first contact structure 40, and the other part of the third contact part 61 is located at the side of the second gate structure away from the first contact structure 40, such that the third contact part 61 is in contact with and electrically conductive to the conductive contact region on the substrate 10. Furthermore, the third contact part 61 can be formed synchronously with the first contact part 401, and the materials of the third contact part 61 and the first contact part 401 are the same, which is beneficial to improve the efficiency and reduce the g difficulty of manufacturing the semiconductor structure.

At S102, a second contact part is formed on the top of the first contact part. The second contact part and the first contact part are connected and form the first contact structure together, the first contact structure is electrically connected to the first gate structure and the substrate, and the sectional area of the first contact part is greater than the sectional area of the second contact part.

Referring to FIG. 13 to FIG. 17, and FIG. 25 to FIG. 28, the first contact structure 40 includes the first contact part 401 and a second contact part 403, and the first contact part 401 is in contact with and electrically conductive to the conductive contact region of the substrate 10 to realize a signal transmission between the first contact structure 40 and the substrate 10. In addition, the first contact structure 40 is also in contact with and electrically conductive to the gate conductive layer 21 of the first gate structure 20, so that the first contact structure 40 can form an interconnecting contact part between the first gate structure 20 and the substrate 10 to realize a single conductive function.

Since the first contact part 401 is located between the first gate structure 20 and the second gate structure, the formed first contact structure 40 is also located between the first gate structure 20 and the second gate structure and is in contact with a sidewall of the first gate structure 20 and a sidewall of the second gate structure, respectively.

In the embodiments, the sectional area of the first contact part 401 is greater than the sectional area of the second contact part 403, which can effectively enlarge the contact area between the first contact part 401 and the substrate 10. Compared with the related art, according to the disclosure, as the integration degree of the semiconductor structure is increasing, the contact area between the first contact structure 40 and the substrate 10 can be ensured, thereby reducing the contact resistance. As a result, the signal transmission efficiency and stability are improved, thereby improving the performance of the semiconductor structure.

Forming the second contact part 403 on the top of the first contact part 401 further includes forming a fourth contact part 62 on the top of the third contact part 61. The third contact part 61 and the fourth contact part 62 are connected and together form the second contact structure 60. As a result, one part of the second contact structure 60 is located at the side of the first gate structure 20 away from the first contact structure 40, and the other part of the second contact structure 60 is located at the side of the second gate structure away from the first contact structure 40. Since the third contact part is in contact with and electrically conductive to the substrate 10, the second contact structure 60 is in contact with and electrically conductive to the conductive contact region of the substrate 10 to realize signal transmission between the second contact structure 60 and the substrate 10. Furthermore, a fourth contact part 62 can be formed synchronously with the formation of the second contact part 403. The materials of the fourth contact part 62 and the second contact part 403 are the same, which is beneficial to reduce the manufacturing difficulty, thereby improving the manufacturing efficiency of the semiconductor structure.

Furthermore, the sectional area of the third contact part 61 is greater than the sectional area of the forth contact part 62. Similar to the first contact structure 40, the contact area between the third contact part 61 and the substrate 10 can also be effectively enlarged. As a result, as the integration degree of the semiconductor structure is increasing, the contact area between the second contact structure 60 and the substrate 10 can be ensured, thereby reducing the contact resistance. As a result, the signal transmission efficiency and stability are improved, thereby improving the performance of the semiconductor structure.

With reference to FIG. 4 to FIG. 17, a possible implementation of the method for manufacturing a semiconductor structure briefly introduced below.

As shown in FIG. 4, similar to the above embodiment, a first gate structure 20 may include a gate conductive layer 21, a gate isolation layer 24 and an insulation sidewall 25. The gate conductive layer 21 is provided on a substrate 10. In the embodiment, a gate oxide layer 22 and a titanium nitride layer 23 may be provided between the gate conductive layer 21 and the substrate 10. Herein, the titanium nitride layer 23 covers the substrate 10, and the gate oxide layer 22 covers the surface of the titanium nitride layer 23 away from the substrate 10. The gate isolation layer 24 is located on the surface of the gate conductive layer 21 away from the substrate 10. The insulation sidewall 25 covers the sidewalls of the gate conductive layer 21 and the gate isolation layer 24. The gate conductive layer 21 may be made of a metal, for example, tungsten. The material of the gate isolation layer 24, for example, may be chosen as silicon nitride. The insulation sidewall 25 may be a composite layer of silicon nitride-silicon oxide-silicon nitride, or a composite layer of silicon oxide-silicon nitride-silicon oxide. A second gate structure is the same as the first gate structure 20, which will not be repeated here.

Figure 7:
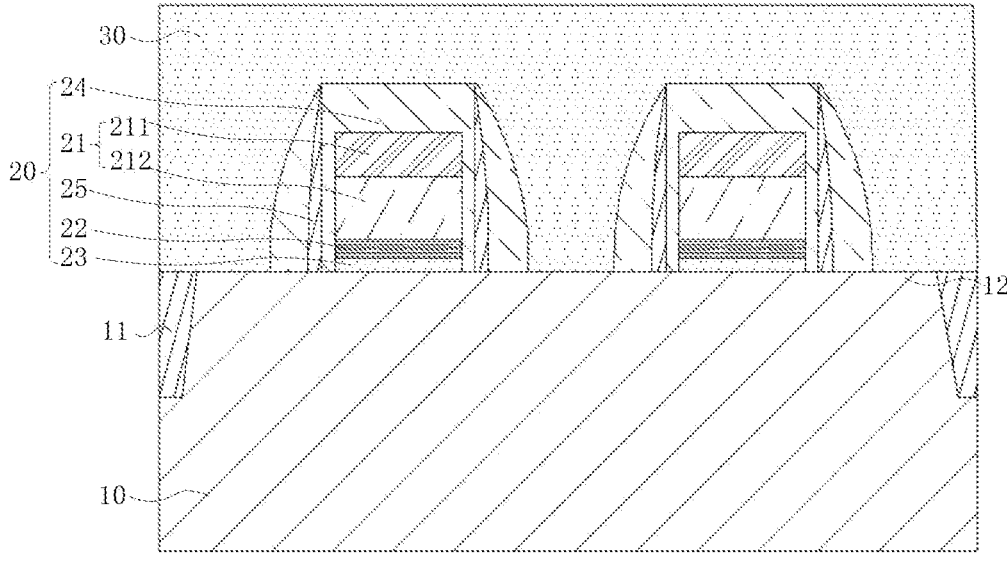
FIG. 7 is a schematic structural diagram corresponding to forming an intermediate dielectric layer in a method for manufacturing a semiconductor structure provided by an embodiment of the disclosure.
Figure 8:
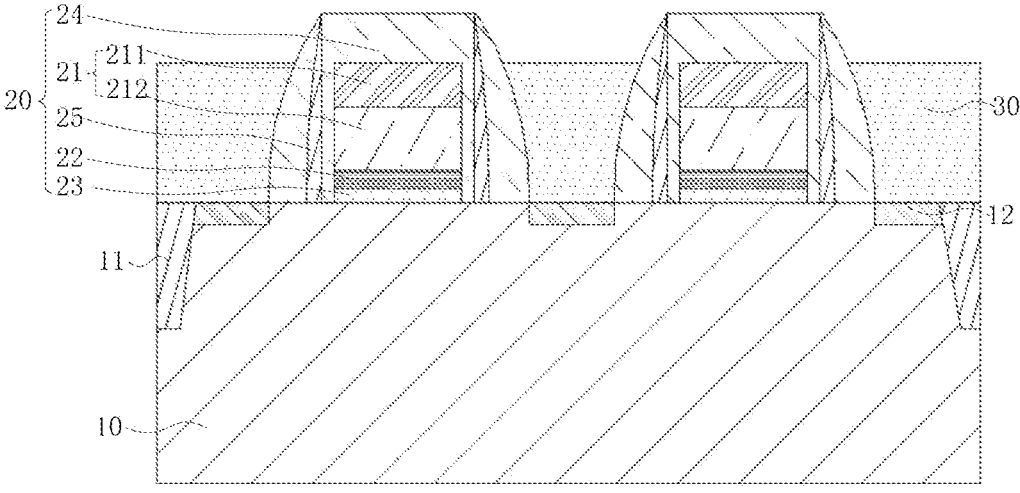
FIG. 8 is a schematic structural diagram 1 corresponding to forming a first dielectric layer in a method for manufacturing a semiconductor structure provided by an embodiment of the disclosure.

Referring to FIG. 7 and FIG. 8, after conductive contact pads 12 are formed, forming a first contact part 401 on the substrate 10 includes the following operation. A first dielectric layer 30 is formed on the substrate 10. The first dielectric layer 30 has a first groove 31, and the first gate structure 20 is located in the first groove 31. The first gate structure 20 includes the gate conductive layer 21, and the first dielectric layer 30, and the top surface of the first dielectric layer 30 is formed to be flush with the top surface of the gate conductive layer 21.

Figure 9:
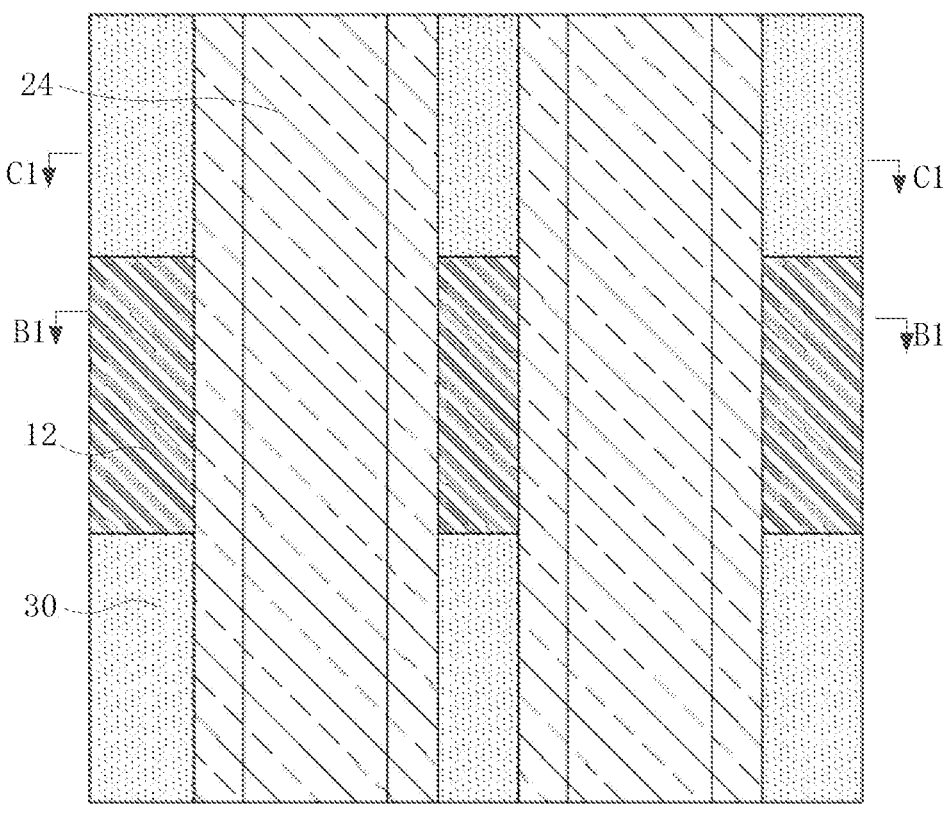
FIG. 9 is a schematic structural diagram 1 corresponding to forming a first groove in a method for manufacturing a semiconductor structure provided by an embodiment of the disclosure.
Figure 10:
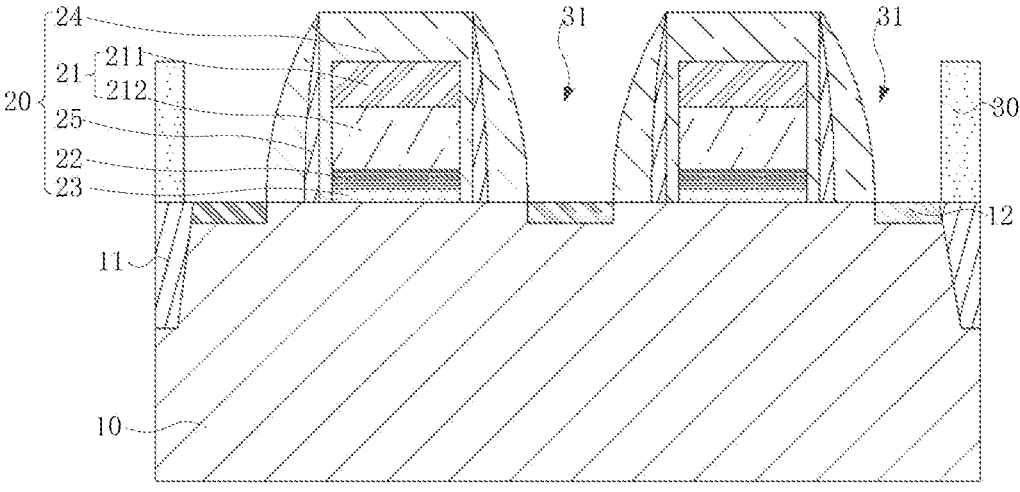
FIG. 10 is a cross-sectional view of a section at B1-B1 in FIG. 9.
Figure 11:
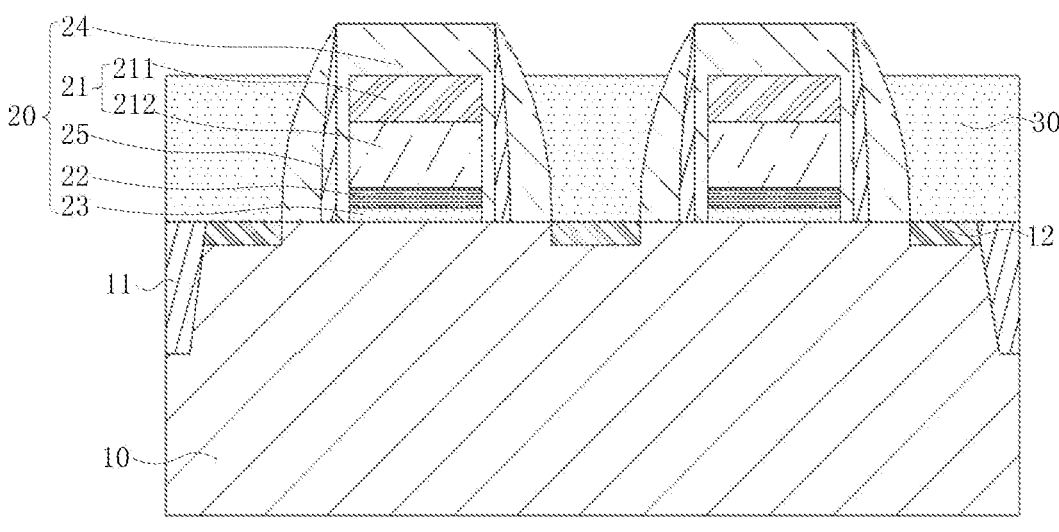
FIG. 11 is a cross-sectional view of a section at C1-C1 in FIG. 9.

Forming the first dielectric layer 30 on the substrate 10 includes the following operations. An intermediate dielectric layer is formed on the substrate 10. The intermediate dielectric layer covers the first gate structure 20 and the second gate structure. After the middle dielectric layer is formed, part of the middle dielectric layer is removed to form the first dielectric layer 30, and to expose the top surfaces of the first gate structure 20 and the second gate structure. "Expose" here means that the top surfaces of the first gate structure 20 and the second gate structure are not covered by the intermediate dielectric layer. Herein, the first dielectric layer 30 is formed to be flush with the top surface of the gate conductive layer 21. As a result, the structural regularity of the semiconductor structure can be improved, thereby reducing the manufacturing difficulty. Referring to FIG. 9, FIG. 10 and FIG. 11, after the first dielectric layer 30 is formed, part of the first dielectric layer 30 is further removed to form a first groove 31, so that the conductive contact pads 12, the first gate structure 20 and the second gate structure are all located in the first groove 31.

Figure 12:
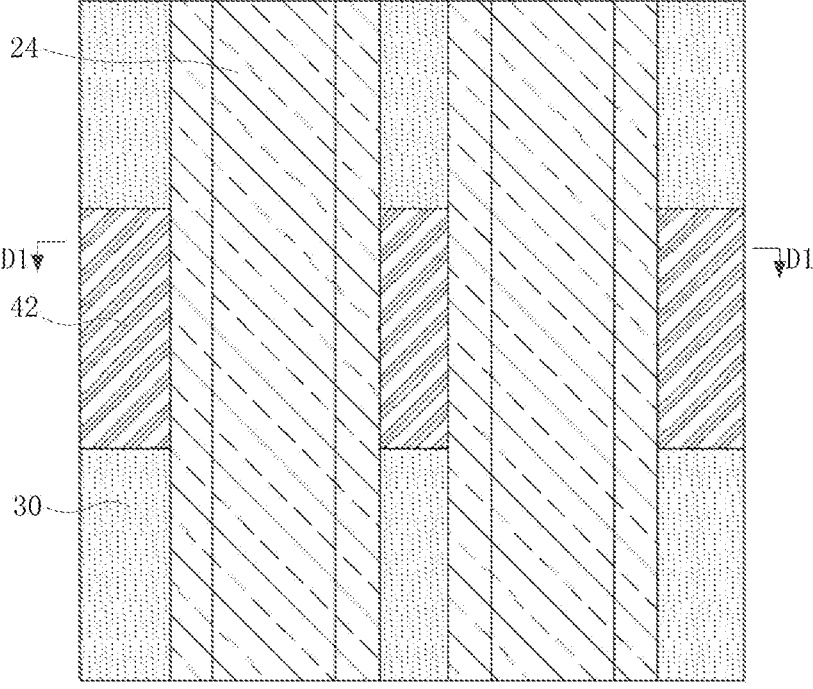
FIG. 12 is a schematic structural diagram 1 corresponding to forming a first contact part in a method for manufacturing a semiconductor structure provided by an embodiment of the disclosure.
Figure 13:
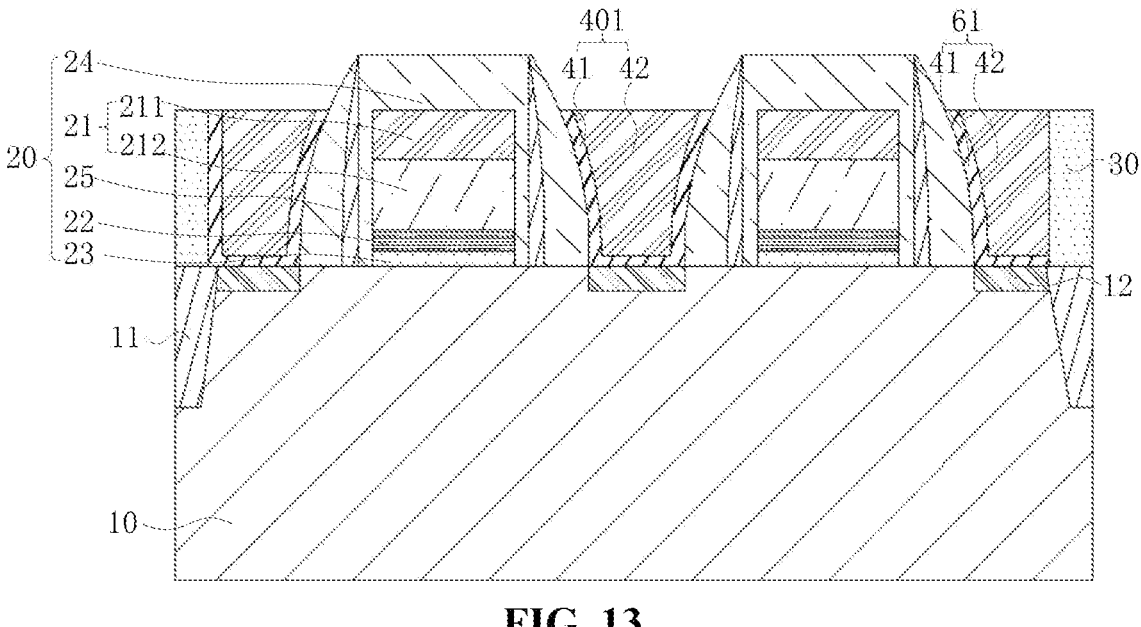
FIG. 13 is a cross-sectional view of a section at D1-D1 in FIG. 12.

Referring to FIG. 12 and FIG. 13, after the first dielectric layer 30 is formed, forming the first contact part 401 on the substrate 10 further includes the following operation. An isolation layer 41 is formed on the bottom and the sidewalls of the first groove 31. Exemplarily, when the isolation layer 41 is formed on the bottom and the sidewalls of the first groove 31, the isolation layer 41 is also formed on the sidewalls of the first gate structure 20 and the second gate structure. Herein, the material of the isolation layer 41 may be titanium nitride which has a good corrosion resistance, good conductivity and good intermetallic adhesion, so that the first contact part 401 has a good electrical connection performance with the substrate 10.

After the isolation layer 41 is formed, forming the first contact part 401 on the substrate 10 further includes the following operation. A conductive material 42 is filled in the first groove 31 to form the first contact part 401. Herein, since the top surface of the first dielectric layer 30 is flush with the top surface of the gate conductive layer 21, the conductive material 42 is filled to be flush with the top surface of the gate conductive layer 21. The conductive material 42 and the isolation layer 41, which are located between the first gate structure 20 and the second gate structure, together constitute the first contact part 401. The conductive material 42 and the isolation layer 41, which are located at the side of the first gate structure 20 away from the first contact part 401, together constitute one part of the third contact part 61. The conductive material 42 and the isolation layer 41, which are located at the side of the second gate structure away from the first contact part 401, together constitute the other part of the third contact part 61. Through the above operations, the first contact part 401 and the third contact part 61 are formed simultaneously, which is beneficial to reduce the production difficulty, thereby improving the manufacturing efficiency of the semiconductor structure.

In the embodiment, after the first contact part 401 is formed, the method further includes the following operation. A second contact part 403 is formed on the top of the first contact part 401.

Figure 14:
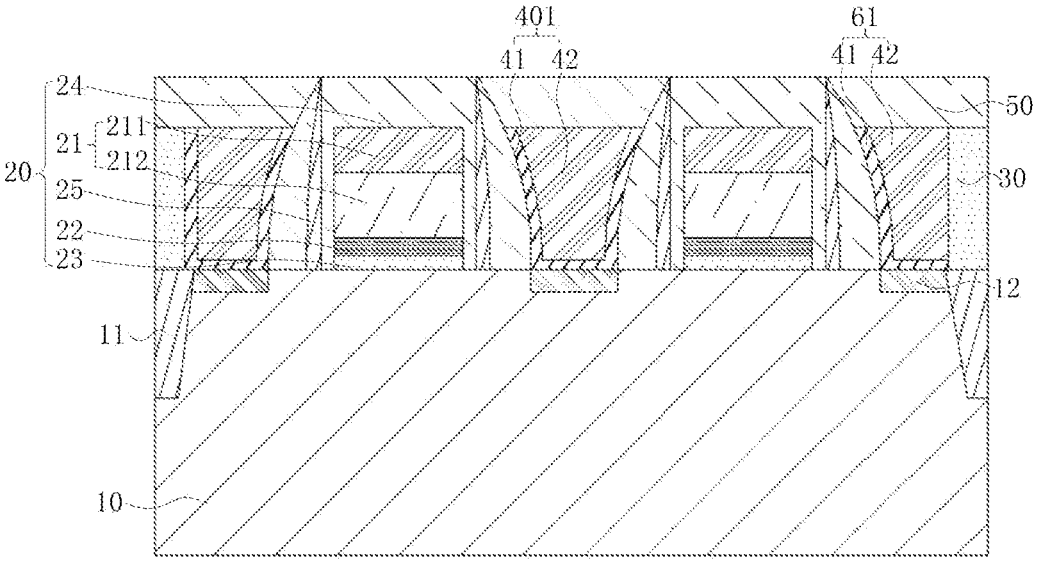
FIG. 14 is a schematic structural diagram 1 corresponding to forming a second dielectric layer in a method for manufacturing a semiconductor structure provided by an embodiment of the disclosure.
Figure 15:
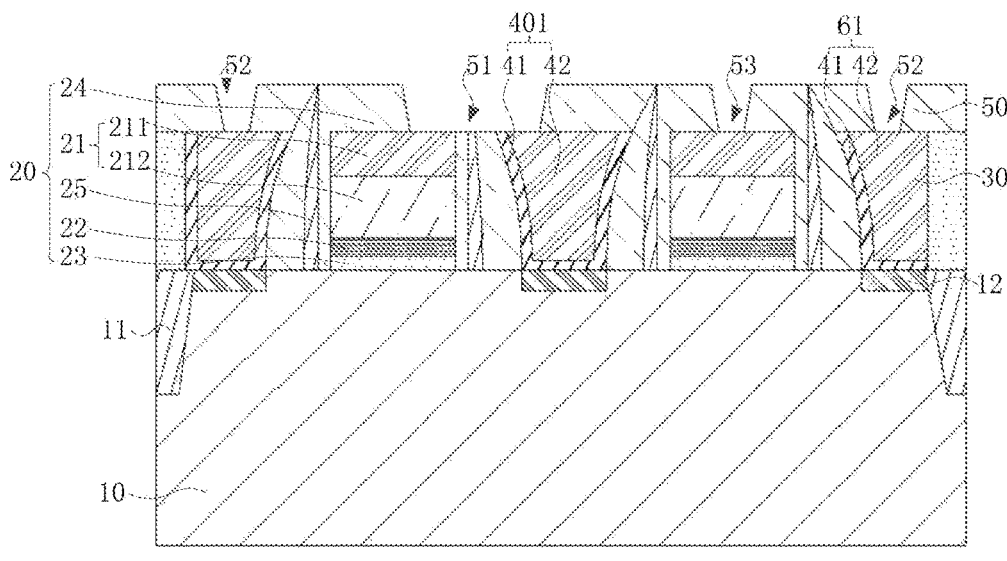
FIG. 15 is a schematic structural diagram 1 corresponding to forming a second groove in a method for manufacturing a semiconductor structure provided by an embodiment of the disclosure.

Referring to FIG. 14, forming the second contact part 403 includes the following operation. A second dielectric layer 50 is formed on the first dielectric layer 30. The second dielectric layer 50 is formed to be flush with the top surface of the first gate structure 20. The second dielectric layer 50 has a second groove 51. The gate conductive layer 21 and the first contact part 401 are comprised the bottom of the second groove 51. Herein, the second dielectric layer 50 is formed to be flush with the top surface of the gate conductive layer 20. As a result, the structural regularity of the semiconductor structure can be improved, thereby reducing the manufacturing difficulty. Referring to FIG. 15, in a specific embodiment, part of the gate isolation layer 24, part of the insulation sidewall 25 of the first gate structure 20 and part of the second dielectric layer 50 are removed, such that the partial top surface of the gate conductive layer 21 and the partial top surface the first contact part 401 are exposed, to form the second groove 51. Herein, the materials of the second dielectric layer 50 and the gate isolation layer 24 may be same, so as to remove the gate isolation layer 24 and the second dielectric layer 50 simultaneously, which further improves the manufacturing efficiency of the semiconductor structure.

It should be noted that, when the second groove 51 is formed, another part of the second dielectric layer 50 can also be removed to form a third groove 52 and a fourth groove 53. A third contact part 61 is comprised the bottom of third groove 52, and the gate conductive layer 21 of the second gate structure is comprised the bottom of the fourth groove 53.

Figure 16:
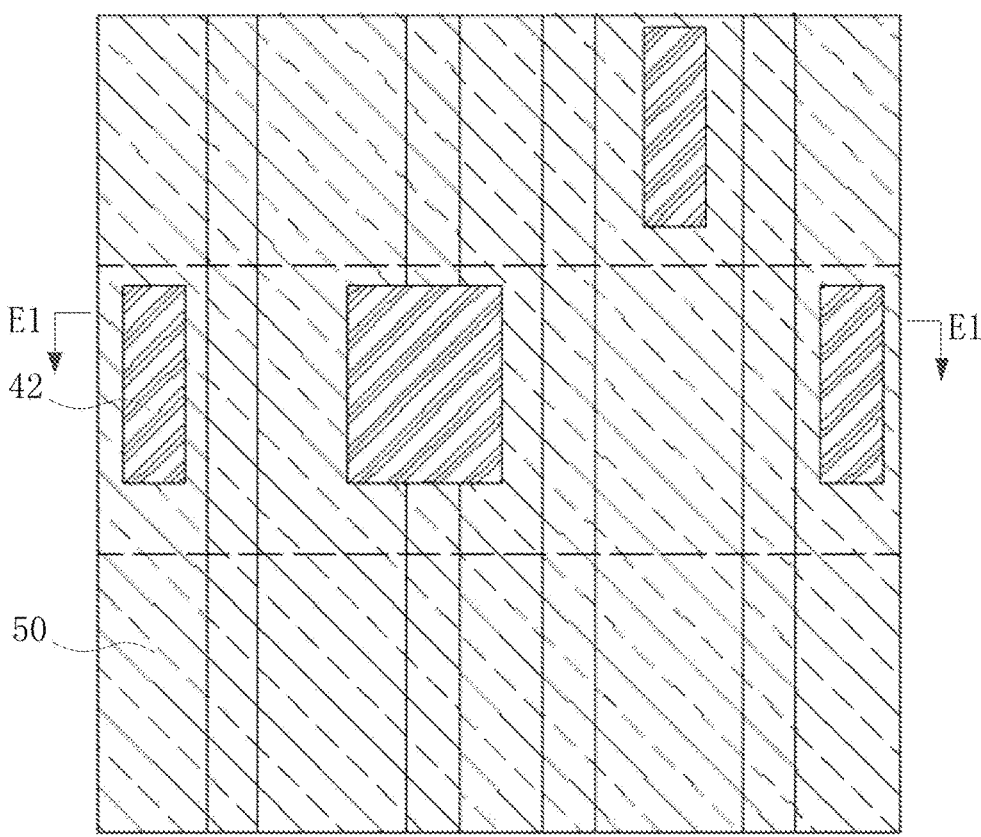
FIG. 16 is a schematic structural diagram 1 corresponding to forming a second contact part in a method for manufacturing a semiconductor structure provided by an embodiment of the disclosure.
Figure 17:
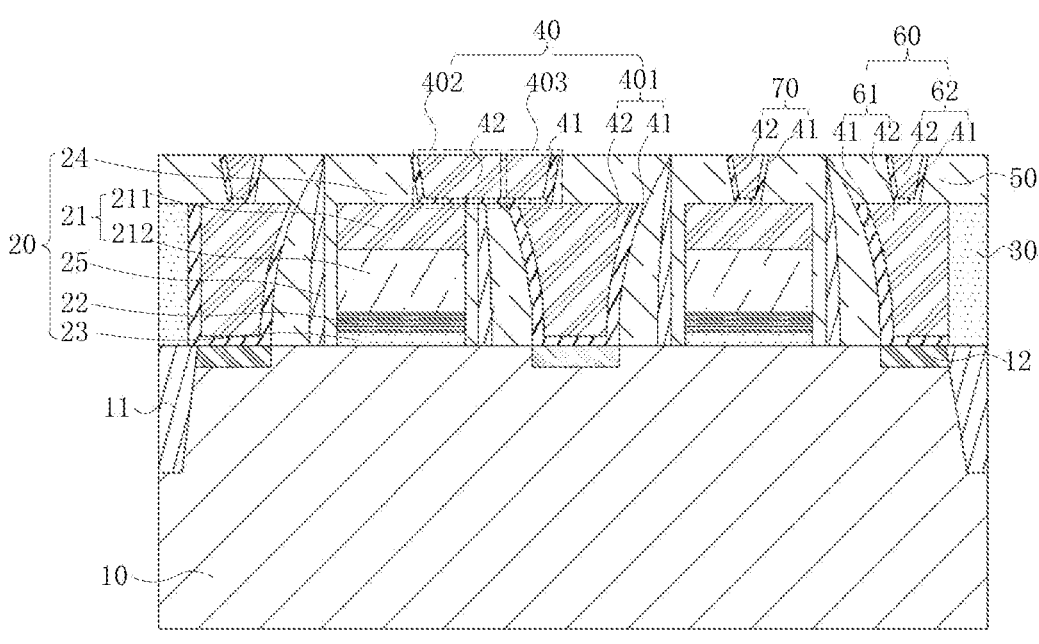
FIG. 17 is a cross-sectional view of a section at E1-E1 in FIG. 16.

Referring to FIG. 16 and FIG. 17, after the second dielectric layer 50 is formed, forming the second contact part 403 further includes the following operation. A conductive structure 402 and the second contact part 403 are formed in the second groove 51, such that the conductive structure 402 is electrically connected to the second contact part 403. It is worth noting that, the conductive structure 402 is in contact with the gate conductive layer 21, and the second contact part 403 is in contact with the first contact part 401. Since the conductive structure 402 is electrically connected to the second contact part 403, the first contact part 401 can be electrically connected to the gate conductive layer 21 via the second contact part 403 and the conductive structure 402, thus realizing the electrical connection between the first contact structure 40 and the first gate structure 20.

In a specific embodiment, forming the conductive structure 402 and the second contact part 403 in the second groove 51 includes the following operation. An isolation layer 41 is formed on the bottom and the sidewalls of the second groove 51. Similarly, the material of the isolation layer 41 may be, for example, titanium nitride which has a good corrosion resistance, good conductivity and good intermetallic adhesion, so that the second contact part 403 formed subsequently has a good electrical connection performance with the first contact part 401 and the gate conductive layer 21, respectively.

After the isolation layer 41 is formed, forming the conductive structure 402 and the second contact part 403 in the second groove 51 further includes the following operation. A conductive material 42 is filled in the second groove 51 to integrally form the conductive structure 402 and the second contact part 403. Herein, the top surface of the second dielectric layer 50 is flush with the top surface of the first gate structure 20, thus the conductive material 42 is filled to be flush with the top surface of the first gate structure 20. Since the conductive material 42 and the isolation layer 41 which are located between the first gate structure 20 and the second gate structure together constitute the integrally formed conductive structure 402 and the second contact part 403, the manufacturing difficulty is reduced, thereby improving the manufacturing efficiency of the semiconductor structure.

It is worth noting that, when the isolation layer 41 is formed in the second groove 51, the isolation layers 41 is also formed on the bottoms and the sidewalls of the third groove 52 and the fourth groove 53, respectively; and when the conductive material 42 is filled in the second groove 51, the conductive material 42 is also filled in the third groove 52 and the fourth groove 53. Therefore, the conductive material 42 and the isolation layer 41 which are located at the side of the first gate structure 20 away from the first contact part 401 together constitute one part of a fourth contact part 62, and the conductive material 42 and the isolation layer 41 which are located at the side of the second gate structure away from the first contact part 401 together constitute the other part of the fourth contact part 62. The conductive material 42 and the isolation layer 41 which are located on the end of the second gate structure away from the substrate 10 constitute a fifth contact part 70. Through the above operations, that the second contact part 403 and the fourth contact part 62 can be formed simultaneously, which is beneficial to reduce the production difficulty, thereby improving the manufacturing efficiency of the semiconductor structure.

Referring to FIG. 18 to FIG. 28, another possible implementation of the method for manufacturing a semiconductor structure is briefly introduced below.

Referring to FIG. 18, the substrate 10 is provided, and a first gate structure 20 is provided on the substrate, in which the first gate structure 20 includes a gate conductive layer 21 and a gate isolation layer 24 covering the top surface of the gate conductive layer 21. One side of the gate conductive layer 21 is covered with an insulation sidewall 25. In the method, providing the substrate 10 including exposing the other side of the gate conductive layer 21 away from the insulation sidewall 25. Here, "exposed" means that the other side of the gate conductive layer 21 and the gate isolation layer 24 is not covered by the insulation sidewall 25.

Figure 19:
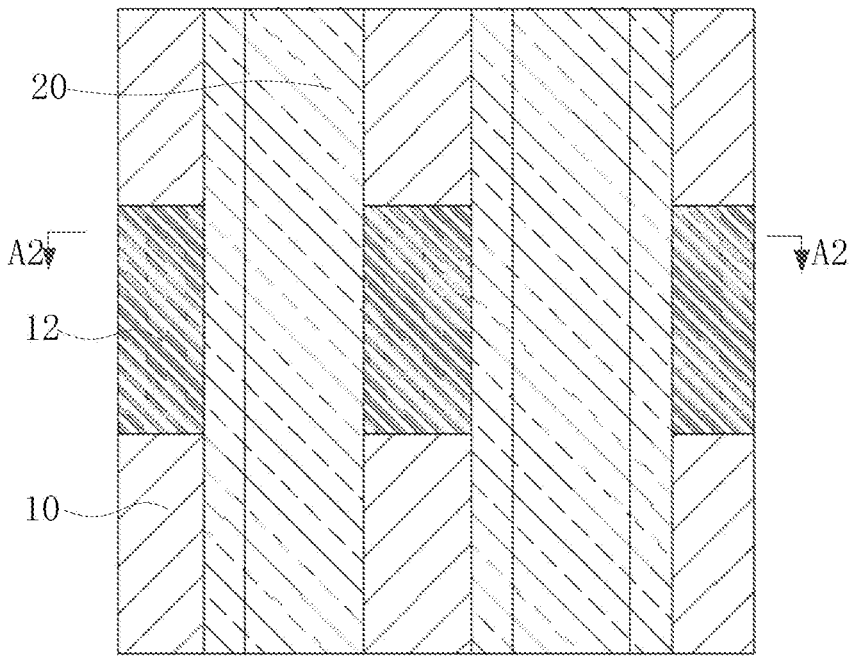
FIG. 19 is a schematic structural diagram 2 corresponding to forming conductive contact pads in a method for manufacturing a semiconductor structure provided by an embodiment of the disclosure.
Figure 20:
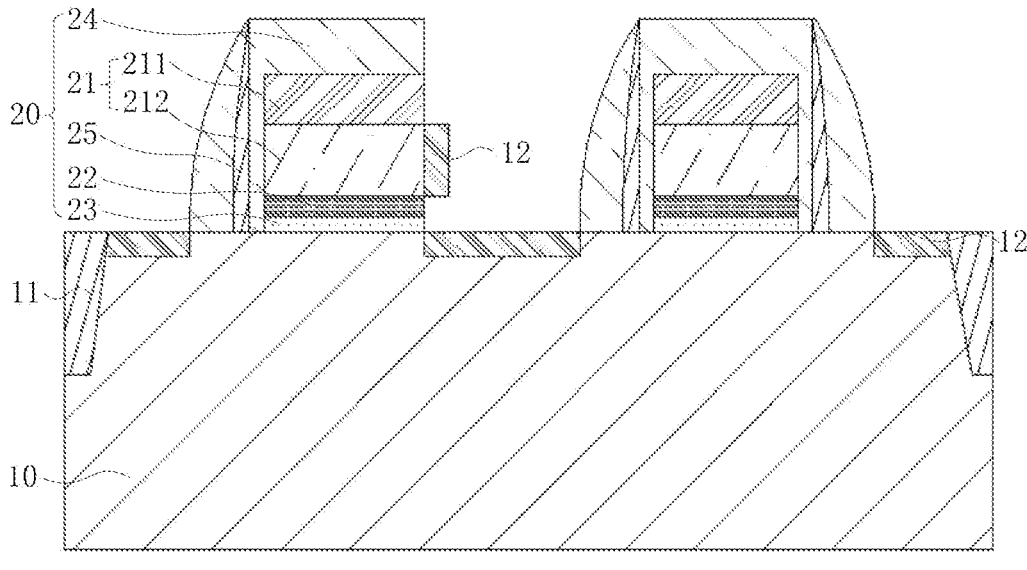
FIG. 20 is a cross-sectional view of a section at A2-A2 in FIG. 18.

Referring to FIG. 19 and FIG. 20, when conductive contact pads 12 are formed in the substrate 10, the method further includes the following operation. The conductive contact pads 12 are formed on a part of the sidewall of the gate conductive layer 21 and in the substrate 10, respectively. In the first gate structure 20, the gate conductive layer 21 includes a first conductive layer 212 and a second conductive layer 211. The first conductive layer 212 covers the surface of the gate oxide layer 22 away from the substrate 10, and the second conductive layer 211 covers the first conductive layer 212. The material of the second conductive layer 211 may include, for example, titanium, tungsten or other conductive metals. The material of the first conductive layer 212 may include, for example, polysilicon. In the process of forming the conductive contact pads 12, a layer of metal material is formed to react with elemental silicon of the first conductive layer 212, so that a conductive contact pad 12 covering the sidewall of the first conductive layer 212 is formed, thereby further improving the conductivity of the gate conductive layer 21.

Figure 21:
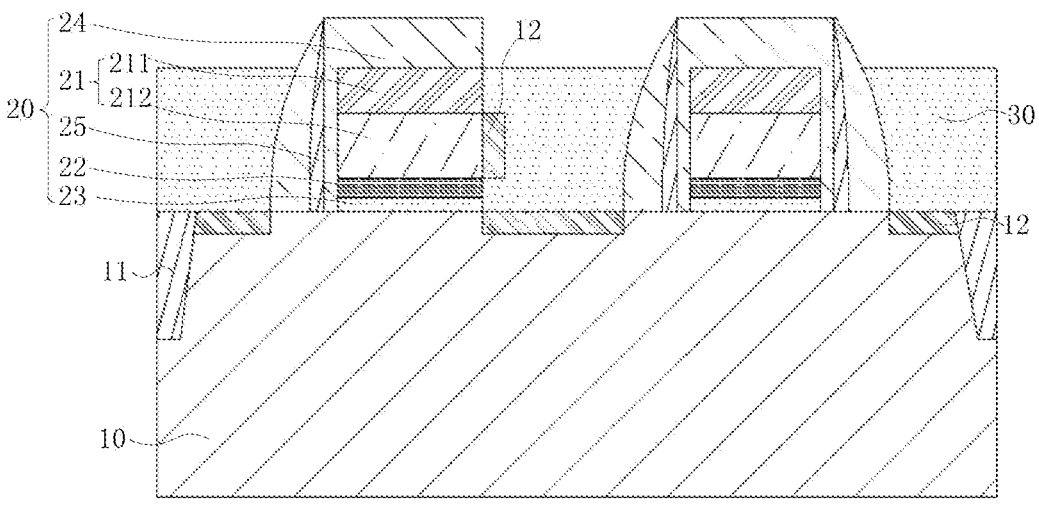
FIG. 21 is a schematic structural diagram 2 corresponding to forming a first dielectric layer in a method for manufacturing a semiconductor structure provided by an embodiment of the disclosure.
Figure 22:
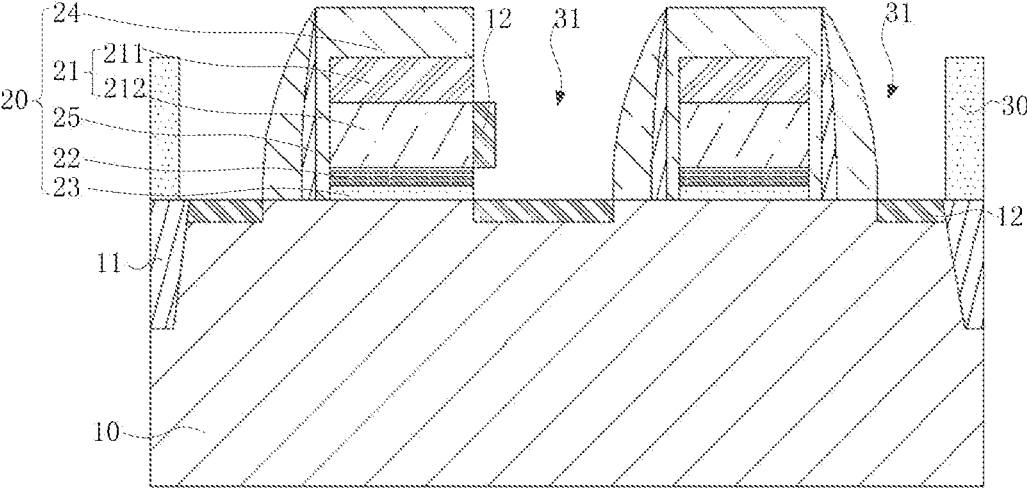
FIG. 22 is a schematic structural diagram 2 corresponding to forming a first groove in a method for manufacturing a semiconductor structure provided by an embodiment of the disclosure.

Referring to FIG. 21 and FIG. 22, after the substrate 10 is provided, forming a first contact part 401 on the substrate 10 includes the following operation. A first dielectric layer 30 is formed on the substrate 10. The first dielectric layer 30 has a first groove 31, and the first gate structure 20 is located in the first groove 31. The top surface of the first dielectric layer 30 is flush with the top surface of the gate conductive layer 21. The operations for forming the first dielectric layer 30 and the first groove 31 are the same as the above embodiment and will not be repeated here. Herein, the first dielectric layer 30 is formed to be flush with the top surface of the gate conductive layer 21. As a result, the structural regularity of the semiconductor structure can be improved, thereby reducing the manufacturing difficulty.

Figure 23:
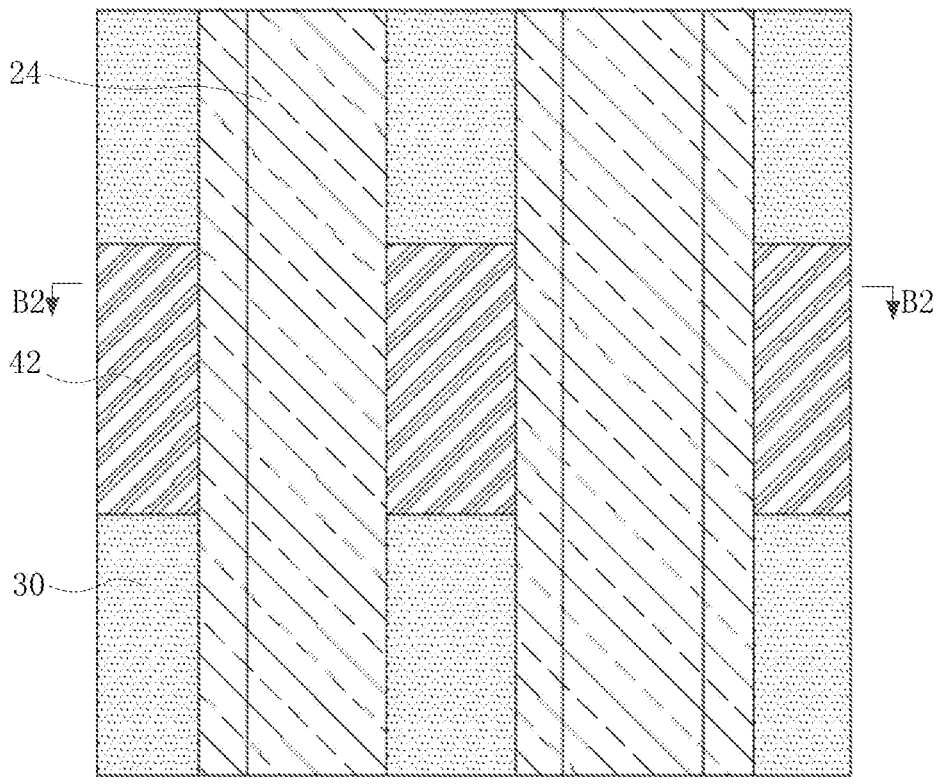
FIG. 23 is a schematic structural diagram 2 corresponding to forming a first contact part in a method for manufacturing a semiconductor structure provided by an embodiment of the disclosure.
Figure 24:
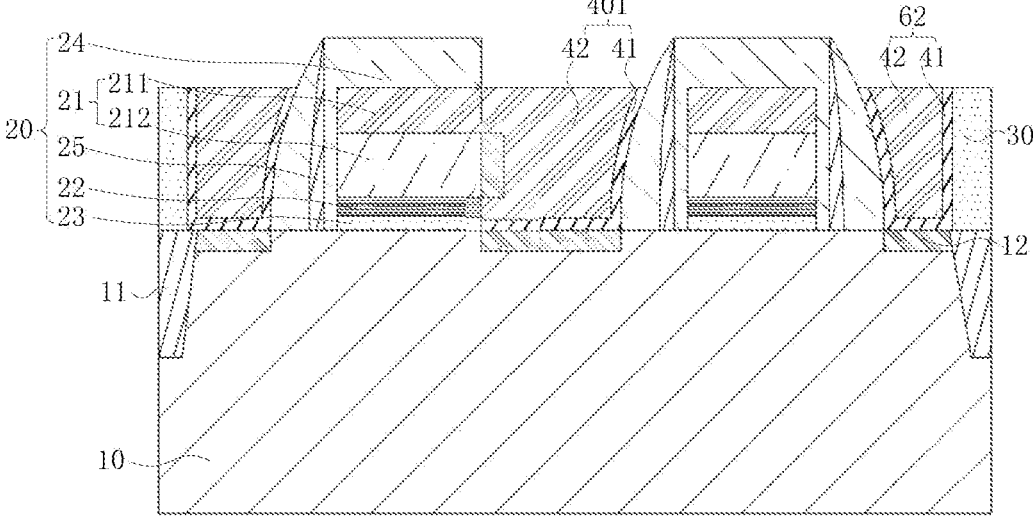
FIG. 24 is a cross-sectional view of a section at B2-B2 in FIG. 23.

Referring to FIG. 23 and FIG. 24, after the first dielectric layer 30 is formed on the substrate 10, forming the first contact part 401 on the he substrate 10 further includes the following operation. An isolation layer 41 is formed on the bottom and the sidewalls of the first groove 31. Similarly, the material of the isolation layer 41 may be, for example, titanium nitride with a good corrosion resistance, good conductivity and good intermetallic adhesion, so that the first contact part 401 formed subsequently has a good electrical connection performance with the substrate 10.

After the isolation layer 41 is formed on the bottom and the sidewalls of the first groove 31, forming the first contact part 401 on the substrate 10 further includes the following operation. A conductive material 42 is filled in the first groove 31 to form the first contact part 401. The first contact part 401 covers part of the sidewall of the gate conductive layer 21 and the top surface of conductive contact pad 12. Since the top surface of the first dielectric layer 30 is flush with the top surface of the gate conductive layer 21, the conductive material 42 is filled to be flush with the top surface of the gate conductive layer 21. Herein, the conductive material 42 covers and is in contact with the sidewall of the second conductive layer 211 and the top surface of the conductive contact pad 12, which is beneficial to further improve the conductivity between the conductive material 42 and the gate conductive layer 21, thereby realizing the electrical connection between the first contact part 401 and the first gate structure 20.

Furthermore, the conductive material 42 and the isolation layer 41, which are located between the first gate structure 20 and a second gate structure, together constitute the first contact part 401. The conductive material 42 and the isolation layer 41, which are located at the side of the first gate structure 20 away from the first contact part 401, together constitute one part of a third contact part 61, and the conductive material 42 and the isolation layer 41, which are located at the side of the second gate structure away from the first contact part 401, together constitute the other part of the third contact part 61. Through the above operations, the first contact part 401 and the third contact part 61 can be formed simultaneously, which is beneficial to reduce the production difficulty, thereby improving the manufacturing efficiency of the semiconductor structure.

Referring to FIG. 25 to FIG. 28, after the first contact part 401 is formed on the substrate 10, the method further includes the following operation. A second contact part 403 is formed on the top of the first contact part 401.

Figure 25:
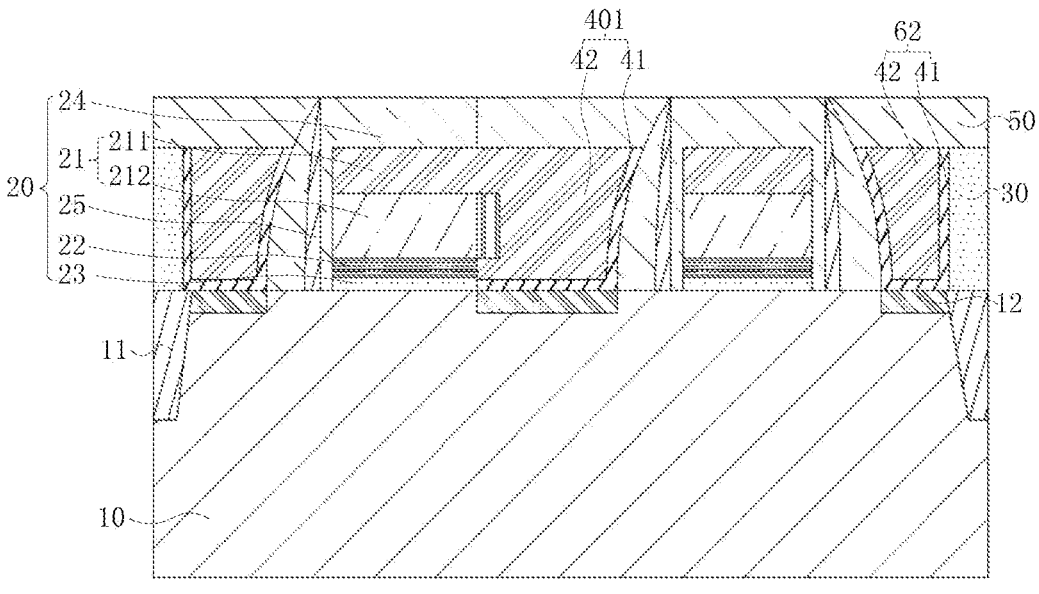
FIG. 25 is a schematic structural diagram 2 corresponding to forming a second dielectric layer in a method for manufacturing a semiconductor structure provided by an embodiment of the disclosure.
Figure 26:
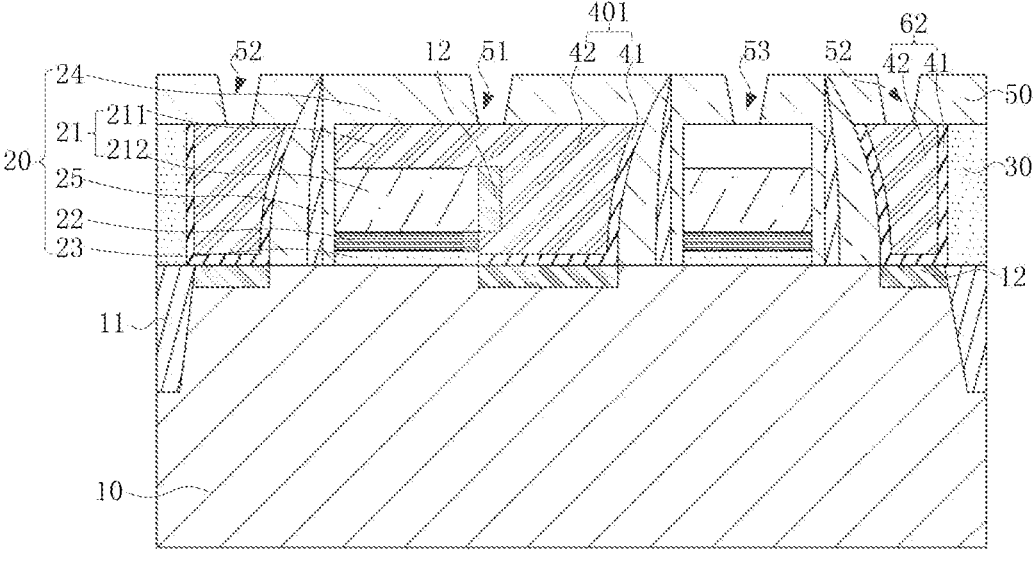
FIG. 26 is a schematic structural diagram 2 corresponding to forming a second groove in a method for manufacturing a semiconductor structure provided by an embodiment of the disclosure.

Referring to FIG. 25 and FIG. 26, forming the second contact part 403 includes the following operations. A second dielectric layer 50 is formed on the first dielectric layer 30. The second dielectric layer 50 is formed to be flush with the top surface of the first gate structure 20, and the second dielectric layer 50 has a second groove 51. Herein, the top surface of the second dielectric layer 50 is flush with the top surface of the first gate conductive layer 20. As a result, the structural regularity of the semiconductor structure can be improved, thereby reducing the manufacturing difficulty. The bottom of the second groove 51 is comprised of the top surfaces of the gate conductive layer 21 and the first contact part 401.

It should be noted that, when the second groove 51 is formed, another part of the second dielectric layer 50 can also be removed to form a third groove 52 and a fourth groove 53. The bottom of third groove 52 is comprised of the third contact part 61, and the bottom of the fourth groove 53 is comprised of the gate conductive layer 21 of the second gate structure.

Figure 27:
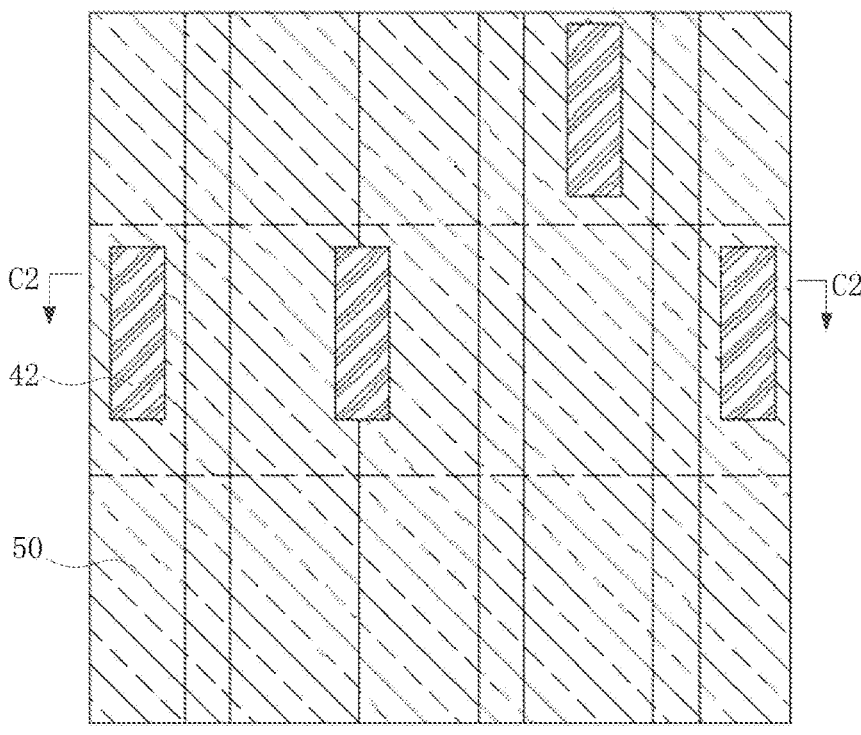
FIG. 27 is a schematic structural diagram 2 corresponding to forming a second contact part in a method for manufacturing a semiconductor structure provided by an embodiment of the disclosure.
Figure 28:
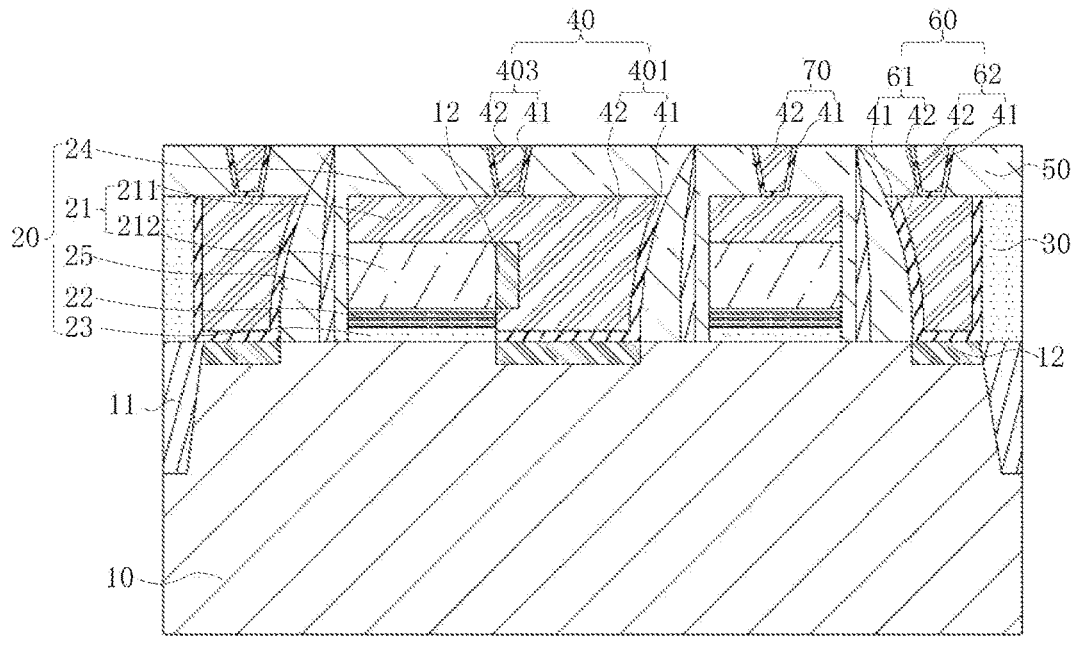
FIG. 28 is a cross-sectional view of a section at C2-C2 in FIG. 27.

Referring to FIG. 27 and FIG. 28, after the second dielectric layer 50 is formed, forming the second contact part 403 further includes the following operation. An isolation layer 41 is formed on the bottom and the sidewalls of the first groove 51. Similarly, the material of the isolation layer 41 may be, for example, titanium nitride with a good corrosion resistance, good conductivity and good intermetallic adhesion, so that the second contact part 403 formed subsequently has a good electrical connection performance with the first contact part 401 and the gate conductive layer 21, respectively.

After the isolation layer 41 is formed on the bottom and the sidewalls of the second groove 51, forming the second contact part 403 further includes the following operation. A conductive material 42 is filled in the second groove 51 to form the second contact part 403. The conductive material 42 and the isolation layer 41, which are located between the first gate structure 20 and the second gate structure, together constitute the second contact part 403. Herein, since the top surface of the second dielectric layer 50 is flush with the top surface of the first gate structure 20, the second contact part 403 is formed to be flush with the top surface of the first gate structure 20, which is beneficial to further improve the regularity of semiconductor structure.

It is worth noting that, when the isolation layer 41 is formed in the second groove 51, the isolation layer 41 is also formed on the bottom and the sidewalls of the third groove 52 and the fourth groove 53, respectively; and when the conductive material 42 is filled in the second groove 51, the conductive material 42 is also filled in the third groove 52 and the fourth groove 53, such that the conductive material 42 and the isolation layer 41, which are located at the side of the first gate structure 20 away from the first contact part 401, together constitute one part of a fourth contact part 62, and the conductive material 42 and the isolation layer 41, which are located at the side of the second gate structure away from the first contact part 401, together constitute the other part of the fourth contact part 62, and the conductive material 42 and the isolation layer 41, which are located on the end of the second gate structure away from the substrate 10, together constitute a fifth contact part 70. Due to the above operations, the second contact part 403 and the fourth contact part 62 can be formed simultaneously, which is beneficial to reduce the production difficulty, thereby improving the manufacturing efficiency of the semiconductor structure.

In the foregoing description, it should be understood that, unless otherwise explicitly specified or defined, the terms "installation", "interconnection" and "connection" should be understood in their broad senses. For example, it may be a fixed connection, indirect connection by an intermediate medium, internal communication between two elements or interaction between two elements. For an ordinary person skilled in the art, the specific meanings of the above terms in the disclosure can be understood according to specific situations. The directions or positional relationships indicated by terms "up", "down", "front", "back", "vertical", "horizontal", "top", "bottom", "inside" or "outside" are based on the directions or positional relationships shown in the drawings. It is only for the convenience of describing the disclosure, not to indicate or imply that the indicated device or element must have a particular orientation, configured and be operated in a particular orientation, and therefore should not be construed as a limitation on the disclosure. In the description of the disclosure, "a plurality of/multiple" means two or more, unless precisely specified otherwise.

The terms "first", "second", "third", "fourth", etc. (if any) in the specification and claims of the disclosure and the drawings are used to distinguish similar objects and do not intend to describe a specific order or sequence. It should be understood that the data thus used can be interchanged under appropriate circumstances, so that the embodiments of the disclosure described herein, for example, can be implemented in an order other than those illustrated or described herein. In addition, the terms "include" and "have" and any variations of them, are intended to cover non-exclusive inclusion, for example, a process, method, system, product, or device that includes a series of steps or units is not necessarily limited to those steps or units that are clearly listed, but may include other steps or units that are not clearly listed, or those inherent to the process, method, product or device.

Finally, it should be noted that, the above embodiments are only used to illustrate the technical solution of this disclosure, but are not limitative of the disclosure. Although the disclosure has been described in detail with reference to the foregoing embodiments, ordinary persons skilled in the art should understand that it is still possible to modify the technical solution described in the foregoing embodiments or to replace some or all of their technical features equivalently. However, these modifications or replacements do not make the essence of corresponding technical solution depart from the scope of the technical solution of the embodiments of this disclosure.

What is claimed is:

1. A semiconductor structure, wherein the semiconductor structure comprises a substrate, and a first gate structure and a first contact structure on the substrate, the first contact structure comprises a first contact part and a second contact part, the first contact part is connected to the second contact part, and the first contact part is located between the second contact part and the substrate, the first contact structure is electrically connected to the first gate structure and the substrate, and sectional area of the first contact part is greater than sectional area of the second contact part; and wherein the first gate structure comprises a gate conductive layer, a conductive structure at an end of the first gate structure away from the substrate, the conductive structure is in contact with the gate conductive layer and electrically connected to the second contact part, and the conductive structure and the second contact part are located in a same plane.

2. The semiconductor structure according to claim 1, wherein the conductive structure and the second contact part further comprise an isolation layer located at bottoms and sidewalls of the conductive structure and the second contact part.

3. The semiconductor structure according to claim 1, wherein the second contact part has an isolation layer at a bottom and sidewalls of the second contact part.

4. The semiconductor structure according to claim 1, wherein the first contact part has an isolation layer at a bottom and sidewalls of the first contact part.

5. The semiconductor structure according to claim 1, wherein the semiconductor structure further comprises a first dielectric layer and a second dielectric layer on the substrate, the first dielectric layer is located between the second dielectric layer and the substrate, the first dielectric layer is flush with a top surface of the gate conductive layer, and the second dielectric layer is flush with a top surface of the first gate structure.

6. The semiconductor structure according to claim 1, wherein the semiconductor structure further comprises a second contact structure and a second gate structure on the substrate, the second gate structure and the first gate structure are spaced apart from each other, the first contact structure is located between the first gate structure and the second gate structure, the first contact structure is in contact with a sidewall of the first gate structure and a sidewall of the second gate structure, respectively, one part of the second contact structure is located at a side of the first gate structure away from the first contact structure, and another part of the second contact structure is located at a side of the second gate structure away from the first contact structure.

7. The semiconductor structure according to claim 6, wherein the second contact structure comprises a third contact part and a fourth contact part, the third contact part is connected to the fourth contact part, the third contact part is located between the fourth contact part and the substrate, and the third contact part is in contact with the substrate and is electrically connected to the substrate; and wherein sectional area of the third contact part is greater than sectional area of the fourth contact part.

8. A method for manufacturing a semiconductor structure, comprising:

providing a substrate, on which a first gate structure is provided;

disposing a second gate structure on the substrate, wherein the second gate structure and the first gate structure are spaced apart from each other;

forming a first contact part on the substrate; and forming a second contact part on a top of the first contact part, wherein the second contact part and the first contact part are connected and together form a first contact structure, the first contact structure is electrically connected to the first gate structure and the substrate, and sectional area of the first contact part is greater than sectional area of the second contact part, the first contact structure is located between the first gate structure and the second gate structure, the first contact structure is in contact with a sidewall of the first gate structure and a sidewall of the second gate structure, respectively, one part of the second contact structure is located at a side of the first gate structure away from the first contact structure, and another part of the second contact structure is located at a side of the second gate structure away from the first contact structure.

9. The method according to claim 8, wherein forming the first contact part on the substrate comprises:

forming a first dielectric layer on the substrate, wherein the first dielectric layer has a first groove, the first gate structure is located in the first groove, the first gate structure comprises a gate conductive layer, and the first dielectric layer is flush with a top surface of the gate conductive layer;

forming an isolation layer on a bottom and sidewalls of the first groove; and filling a conductive material in the first groove to form the first contact part.

10. The method according to claim 9, wherein forming the second contact part on the top of the first contact part comprising:

forming a second dielectric layer on the first dielectric layer, wherein the second dielectric layer is flush with a top surface of the first gate structure, the second dielectric layer has a second groove, and a bottom of the second groove is comprised of the gate conductive layer and the first contact part; and forming a conductive structure and the second contact part in the second groove such that the conductive structure and the second contact part are electrically connected.

11. The method according to claim 10, wherein forming the conductive structure and the second contact part in the second groove comprises:

forming the isolation layer on the bottom and sidewalls of the second groove;

filling the conductive material in the second groove to integrally form the conductive structure and the second contact part.

12. The method according to claim 8, wherein providing the substrate, on which the first gate structure is provided, comprises:

wherein the first gate structure comprises a gate conductive layer and a gate isolation layer covering a top surface of the gate conductive layer, a side of the gate conductive layer is covered with an insulation sidewall, exposing another side of the gate conductive layer away from the insulation sidewall; and forming conductive contact pads on a part of an exposed sidewall of the gate conductive layer and on the substrate, respectively.

13. The method according to claim 12, wherein forming the first contact part on the substrate comprises:

forming a first dielectric layer on the substrate, wherein the first dielectric layer has a first groove, the first gate structure is located in the first groove, and the first dielectric layer is formed to be flush with a top surface of the gate conductive layer;

forming an isolation layer on a bottom and sidewalls of the first groove;

filling a conductive material in the first groove to form the first contact part, wherein the first contact part covers part of the exposed sidewall of the gate conductive layer and top surfaces of the conductive contact pads.

14. The method according to claim 13, wherein forming the second contact part on the top of the first contact part comprising:

forming a second dielectric layer on the first dielectric layer, wherein the second dielectric layer is formed to be flush with a top surface of the first gate structure, and the second dielectric layer has a second groove;

forming the isolation layer on a bottom surface and sidewalls of the second groove; and filling the conductive material in the second groove to form the second contact part.

15. The method according to claim 8, wherein forming the first contact part on the substrate further comprises:

forming a third contact part on the substrate, wherein the third contact part is in contact with the substrate and electrically connected to the substrate, and wherein forming the second contact part on the top of the first contact part further comprises:

forming a fourth contact part on a top of the third contact part, wherein the third contact part and the fourth contact part are in connection and together form a second contact structure, and one part of the second contact structure is located at a side of the first gate structure away from the first contact structure, another part of the second contact structure is located at a side of the second gate structure away from the first contact structure, and sectional area of the third contact part is greater than sectional area of the fourth contact part.

16. A semiconductor structure, wherein the semiconductor structure comprises a substrate, and a first gate structure and a first contact structure on the substrate, the first contact structure comprises a first contact part and a second contact part, the first contact part is connected to the second contact part, and the first contact part is located between the second contact part and the substrate, the first contact structure is electrically connected to the first gate structure and the substrate, and sectional area of the first contact part is greater than sectional area of the second contact part; and wherein the first gate structure comprises a gate conductive layer, the first contact part is in contact with a sidewall of the gate conductive layer, and the first contact part is flush with a top surface of the gate conductive layer.

17. The semiconductor structure according to claim 16, wherein a part of the sidewall of the gate conductive layer is covered with a conductive contact pad, and the first contact part is in contact with a top surface of the conductive contact pad.

18. The semiconductor structure according to claim 17, wherein a material of the conductive contact pad is a metal silicide.

19. The semiconductor structure according to claim 16, wherein the second contact part has an isolation layer at a bottom and sidewalls of the second contact part.

20. The semiconductor structure according to claim 16, wherein the semiconductor structure further comprises a first dielectric layer and a second dielectric layer on the substrate, the first dielectric layer is located between the second dielectric layer and the substrate, the first dielectric layer is flush with a top surface of the gate conductive layer, and the second dielectric layer is flush with a top surface of the first gate structure.

\* \* \* \* \*